(12) United States Patent
Chiba et al.

(10) Patent No.: US 11,081,976 B2
(45) Date of Patent: Aug. 3, 2021

(54) DIELECTRIC ELASTOMER TRANSDUCER AND DIELECTRIC ELASTOMER DRIVING DEVICE

(71) Applicants: AISIN AW CO., LTD., Anjo (JP); Seiki Chiba, Tokyo (JP); Mikio Waki, Sakura (JP)

(72) Inventors: Seiki Chiba, Tokyo (JP); Mikio Waki, Sakura (JP)

(73) Assignee: AISIN AW CO., LTD., Anjo (JP)

( * ) Notice: Subject to any disclaimer, the term of this patent is extended or adjusted under 35 U.S.C. 154(b) by 57 days.

(21) Appl. No.: 16/620,576

(22) PCT Filed: Jun. 11, 2018

(86) PCT No.: PCT/JP2018/022230
§ 371 (c)(1),
(2) Date: Dec. 9, 2019

(87) PCT Pub. No.: WO2018/235658
PCT Pub. Date: Dec. 27, 2018

(65) Prior Publication Data
US 2021/0143756 A1  May 13, 2021

(30) Foreign Application Priority Data
Jun. 21, 2017 (JP) .............................. JP2017-121073

(51) Int. Cl.
*H02N 11/00* (2006.01)
*H02N 1/00* (2006.01)

(52) U.S. Cl.
CPC .................................. *H02N 1/006* (2013.01)

(58) Field of Classification Search
CPC ........ H02N 1/00; H02N 1/002; H02N 11/006; H02N 1/06; H02N 1/08; H02N 11/00
See application file for complete search history.

(56) References Cited

U.S. PATENT DOCUMENTS 6,812,624 B1 * 11/2004 Pei .................. H01L 41/113
310/309
7,075,213 B2 * 7/2006 Krill ................ F16D 13/12
310/328
(Continued)

FOREIGN PATENT DOCUMENTS

JP   2007118159 A  * 5/2007  ............ B25J 19/00
JP   2011-234529 A    11/2011
(Continued)

OTHER PUBLICATIONS

International Search Report of PCT/JP2018/022230 dated Sep. 11, 2018 [PCT/ISA/210].

*Primary Examiner* — Burton S Mullins
(74) *Attorney, Agent, or Firm* — Sughrue Mion, PLLC

(57) ABSTRACT

A dielectric elastomer transducer includes a dielectric elastomer function element having a dielectric elastomer layer and a pair of electrode layers between which the dielectric elastomer function element is interposed, and further includes a supporting body that supports the dielectric elastomer function element. Each of the electrode layers has one or more application regions. The dielectric elastomer function element has one or more function portions on which the application regions of the electrode layers are overlapped. The function portion is spaced away from the supporting body. With such a configuration, it is possible to avoid damaging the electrode layer and acquire a sufficient amount of expansion.

19 Claims, 23 Drawing Sheets

(56) References Cited

U.S. PATENT DOCUMENTS

| | | | | |
|---|---|---|---|---|
| 7,233,097 B2 * | 6/2007 | Rosenthal | ............ | H02N 11/006 310/328 |
| 2006/0074325 A1 * | 4/2006 | Karo | .................... | F04B 11/005 600/494 |
| 2014/0250881 A1 * | 9/2014 | Yamamoto | .......... | H01L 41/0953 60/527 |

FOREIGN PATENT DOCUMENTS

| JP | 2012-065427 A | 3/2012 |
|---|---|---|
| JP | 2013-055877 A | 3/2013 |

* cited by examiner

DIELECTRIC ELASTOMER TRANSDUCER AND DIELECTRIC ELASTOMER DRIVING DEVICE

CROSS REFERENCE TO RELATED APPLICATIONS

This application is a National Stage of International Application No. PCT/JP2018/022230, filed Jun. 11, 2018, claiming priority to Japanese Patent Application No. 2017-121073, filed Jun. 21, 2017.

TECHNICAL FIELD

The present disclosure relates to a dielectric elastomer transducer and a dielectric elastomer driving device.

BACKGROUND ART

A driving device that has a dielectric elastomer transducer using a dielectric elastomer has an advantage compared to an electric motor etc., such as being lightweight and having excellent reactivity. FIGS. 24 and 25 illustrate a conventional dielectric elastomer transducer and a conventional dielectric elastomer driving device (Patent Document 1). The dielectric elastomer driving device illustrated in FIGS. 24 and 25 includes a dielectric elastomer transducer 90 and a power source unit 95. The dielectric elastomer transducer 90 includes a dielectric elastomer layer 91, a pair of electrode layers 92, 93, and a tensile force maintaining body 94. The dielectric elastomer layer is made from a prescribed resin material. The electrode layers 92, 93 are each formed on a corresponding surface of the dielectric elastomer layer 91. As illustrated in FIG. 24, a sheet of material of a sufficient size is wound so that the dielectric elastomer layer 91 and the electrode layers 92, 93 have a multiple layer cylindrical shape. As illustrated in FIG. 25, in the dielectric elastomer transducer 90, the dielectric elastomer layer 91 and the electrode layers 92, 93 are wound around the tensile force maintaining body 94. The tensile force maintaining body 94 maintains a tensile force that causes the dielectric elastomer layer 91 to expand in an axial direction. When a voltage is applied to the electrode layers 92, 93 from the power source unit 95, a Coulomb force causes the electrode layers 92, 93 to attract each other. With the attractive force, the thickness of the dielectric elastomer layer 91 is decreased and the size in the axial direction is increased. The dielectric elastomer transducer 90 thus expands in the axial direction. In a dielectric elastomer driving device X, it is possible to expand or contract the dielectric elastomer transducer 90 by controlling the application of a voltage from the power source unit 95.

The configuration in which the dielectric elastomer layer 91 and the electrode layers 92, 93 have a multiple layer cylindrical shape is intended to increase the driving force of the dielectric elastomer transducer 90. However, with such a configuration, there are concerns regarding the following points.

In the dielectric elastomer transducer 90, the dielectric elastomer layer 91 and the electrode layers 92, 93 are wound around the tensile force maintaining body 94. A deformation in which an axial center portion is constricted occurs in the dielectric elastomer layer 91 in which the tensile force of expanding the dielectric elastomer layer 91 in the axial direction is maintained by the tensile force maintaining body 94, even in a case where the dielectric elastomer layer 91 and the electrode layers 92, 93 are not joined to the tensile force maintaining body 94. The electrode layers 92, 93 are pressed against the tensile force maintaining body 94 or the electrode layers 92, 93 are in close contact with each other. If a voltage application control from the power source unit 95 causes the dielectric elastomer transducer 90 to expand or contract in such a state, a situation may occur in which the electrode layers 92, 93 are unreasonably rubbed and the electrode layers 92, 93 may become damaged. A part of the dielectric elastomer transducer 90 that is fixed to the tensile force maintaining body 94 does not contribute to expansion even if a voltage is applied.

RELATED ART DOCUMENTS

Patent Documents

Patent Document 1: Japanese Unexamined Patent Application Publication No. 2012-65427 (JP 2012-65427 A)

SUMMARY OF THE DISCLOSURE

Problem to be Solved by the Invention

The various aspects of the disclosure were developed in view of the above problem, and it is an aspect to provide a dielectric elastomer transducer and a dielectric elastomer driving device capable of acquiring a sufficient amount of expansion while avoiding damaging the electrode layer.

Means for Solving the Problem

A dielectric elastomer transducer provided by a first aspect of the invention includes a dielectric elastomer function element having a dielectric elastomer layer and a pair of electrode layers between which the dielectric elastomer layer is interposed, and further includes a supporting body that supports the dielectric elastomer function element, in which each of the electrode layers has one or more application regions, the dielectric elastomer function element has one or more function portions on which the application regions of the electrode layers are overlapped, and the function portion is spaced away from the supporting body.

In a preferred embodiment, the dielectric elastomer function element has one or more electrode-less portions in which the electrode layer is not provided, and the electrode-less portion is fixed to the supporting body.

In a preferred embodiment, the dielectric elastomer function element has a tubular shape in which at least the function portion is a single sheet without overlapping.

In a preferred embodiment of the invention, the dielectric elastomer function element has a plurality of the function portions that are spaced away from each other in an axial direction.

In a preferred embodiment of the invention, the application region is divided into a plurality of portions in a circumferential direction.

In a preferred embodiment of the invention, the electrode layer has a coupling portion that couples together the application regions, and the coupling portion is not fixed to the supporting body.

In a preferred embodiment of the invention, the coupling portion of one of the electrode layers does not overlap with the other electrode layer.

In a preferred embodiment of the invention, the supporting body is formed of a plurality of plate members that have a circular shape when viewed in an axial direction and that are disposed so as to be spaced away in the axial direction.

In a preferred embodiment of the invention, a wiring connected to the application region is further included.

In a preferred embodiment of the invention, a tensile force maintaining body that causes the dielectric elastomer function element to expand is further included.

A dielectric elastomer driving device provided by a second aspect of the invention is characterized by including: the dielectric elastomer transducer provided by the first aspect of the disclosure; and a power source unit for applying a voltage to the dielectric elastomer transducer.

Effects of the Various Aspects of the Disclosure

According to certain aspects, it is possible to avoid damaging an electrode layer while acquiring a sufficient amount of expansion.

Other features and advantages will become apparent with the detailed description below with reference to the attached drawings.

DETAILED DESCRIPTION

Hereinafter, the an embodiment will be described in detail with reference to the drawings.

FIGS. 1 to 8 illustrate a dielectric elastomer transducer and a dielectric elastomer driving device of a first embodiment. A dielectric elastomer driving device B1 of the embodiment includes a dielectric elastomer transducer A1 and a power source unit 7. The dielectric elastomer driving device B1 is a device that outputs a driving force by operating the dielectric elastomer transducer A1 based on a voltage applied by the power source unit 7, for example. The application of the dielectric elastomer driving device B1 is not specifically limited, and as a typical example, the application may be a robot arm or an artificial hand etc.

Figure 1:
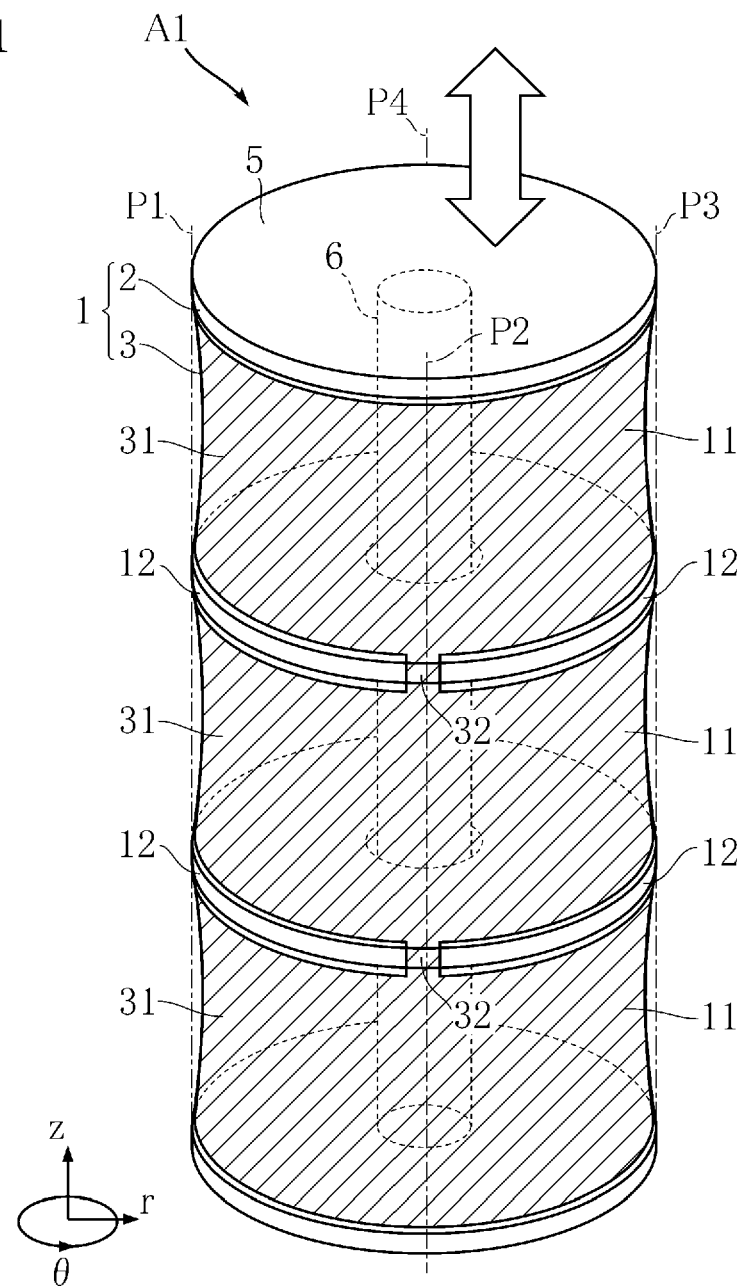
FIG. 1 is a perspective view of a dielectric elastomer transducer and a dielectric elastomer driving device according to a first.
Figure 2:
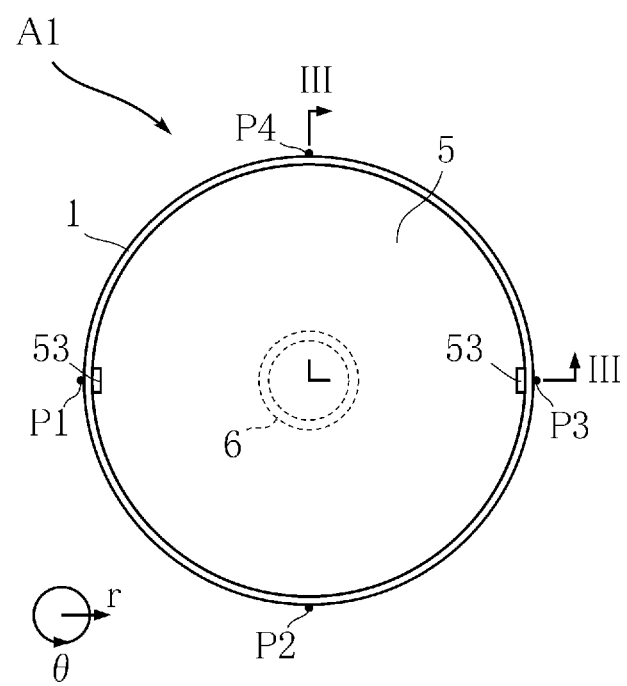
FIG. 2 is a plan view of the dielectric elastomer transducer and the dielectric elastomer driving device according to the first embodiment.
Figure 3:
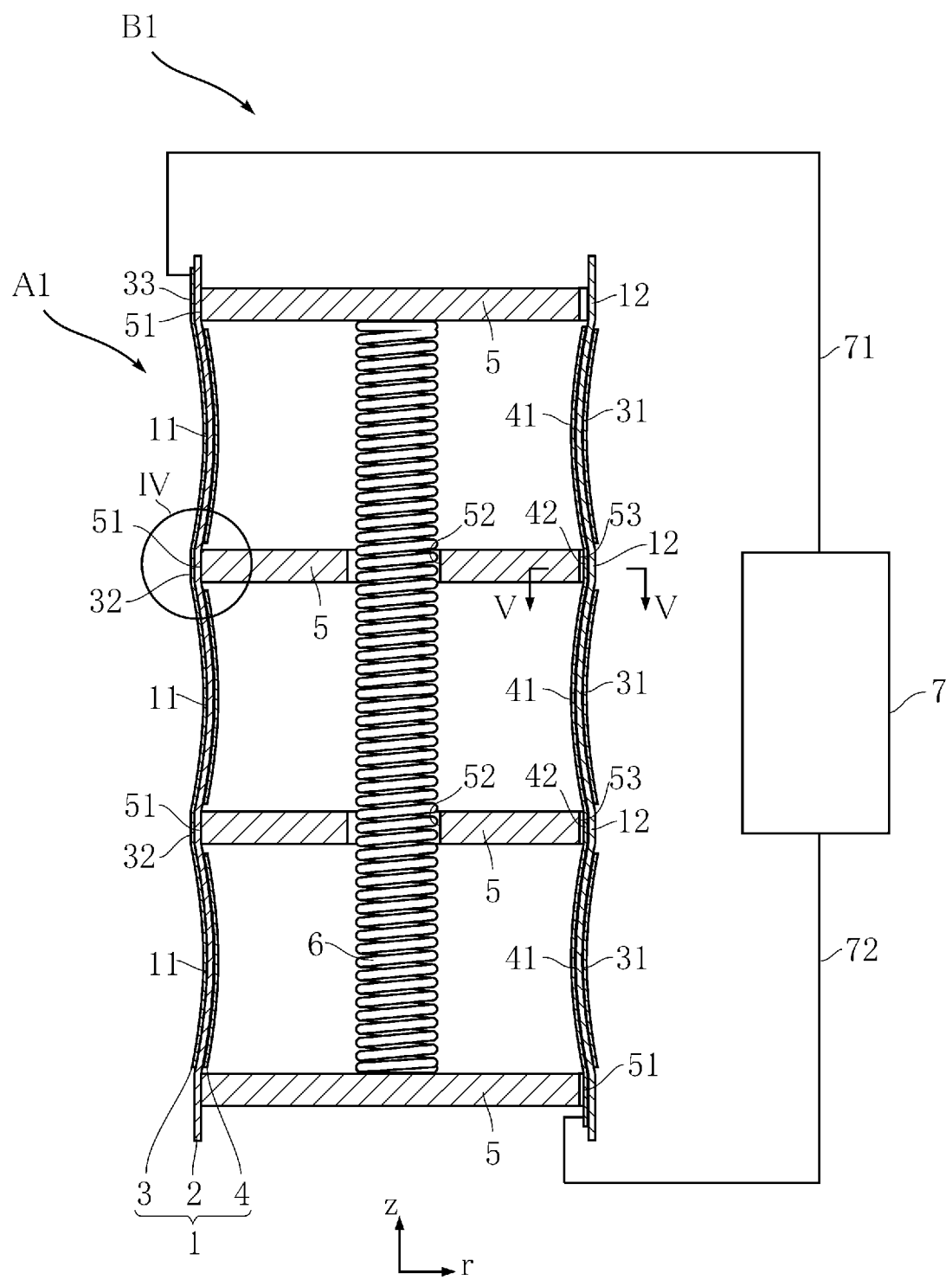
FIG. 3 is a sectional view taken along line in FIG. 2.
Figure 4:
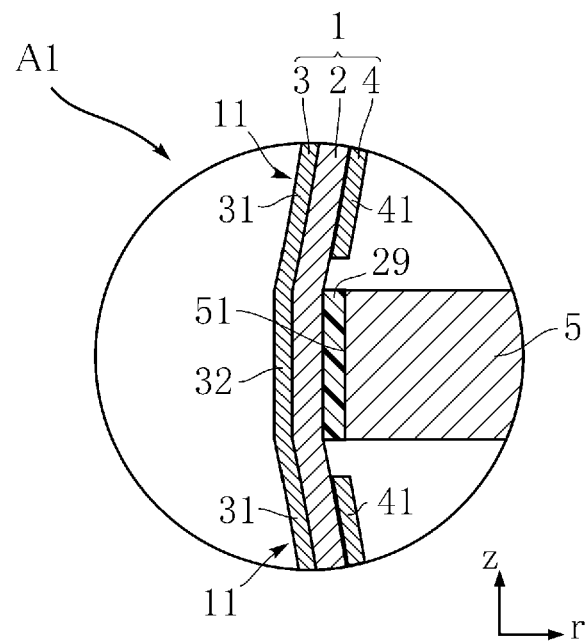
FIG. 4 is an enlarged sectional view of a main part illustrating a part indicated as IV in FIG. 3.
Figure 5:
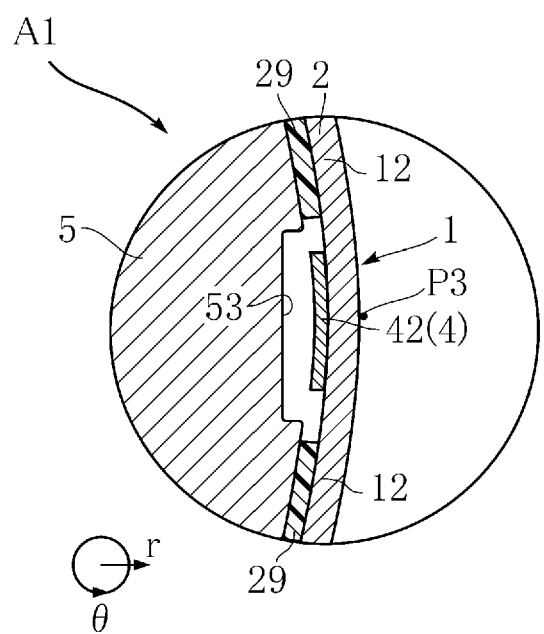
FIG. 5 is an enlarged sectional view of a main part, taken along line V-V in FIG. 3.
Figure 6:
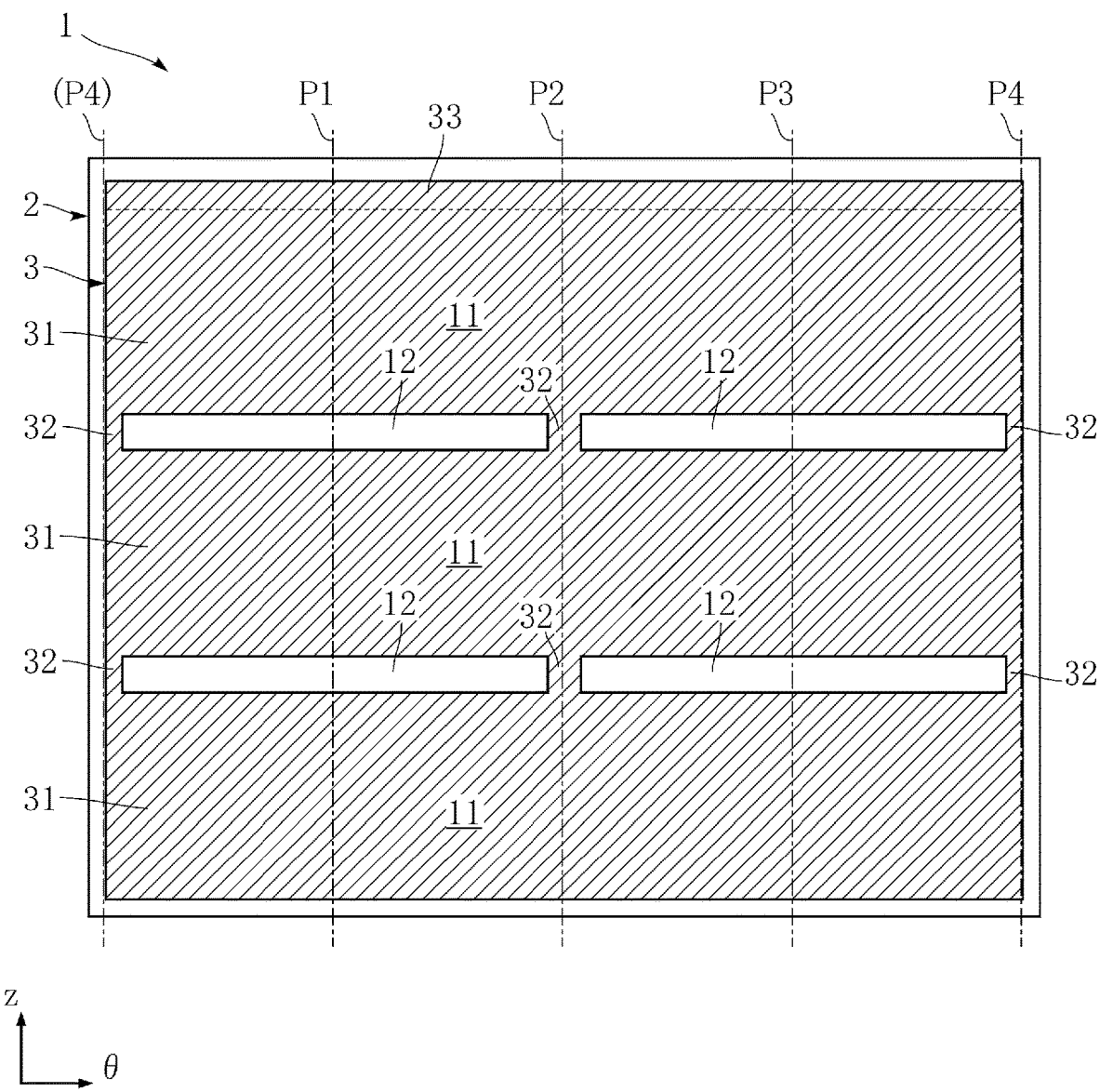
FIG. 6 is a plan view of development of a dielectric elastomer layer and an electrode layer of the dielectric elastomer transducer according to the first embodiment.
Figure 7:
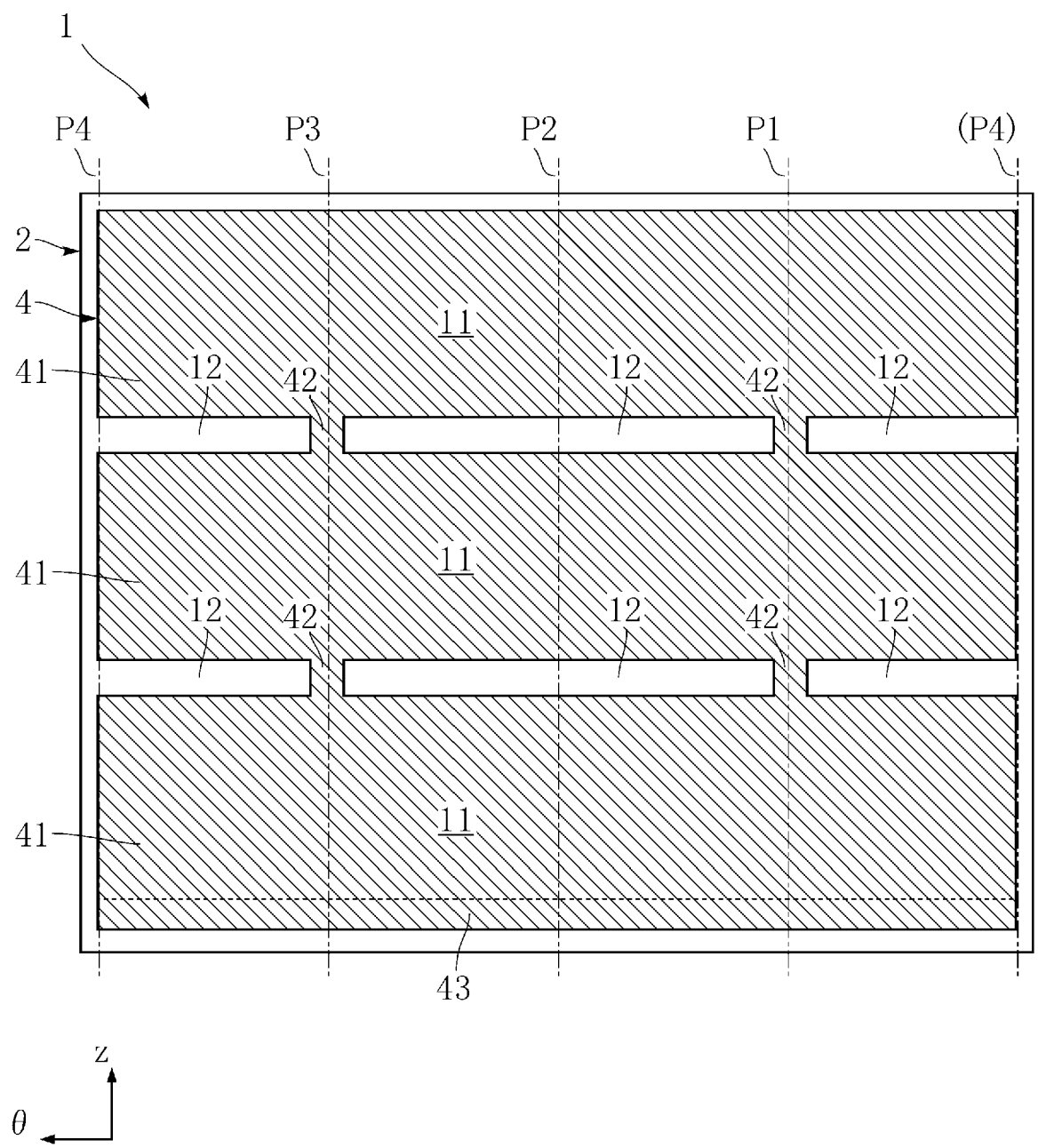
FIG. 7 is a plan view of development of the dielectric elastomer layer and an electrode layer of the dielectric elastomer transducer according to the first embodiment.
Figure 8:
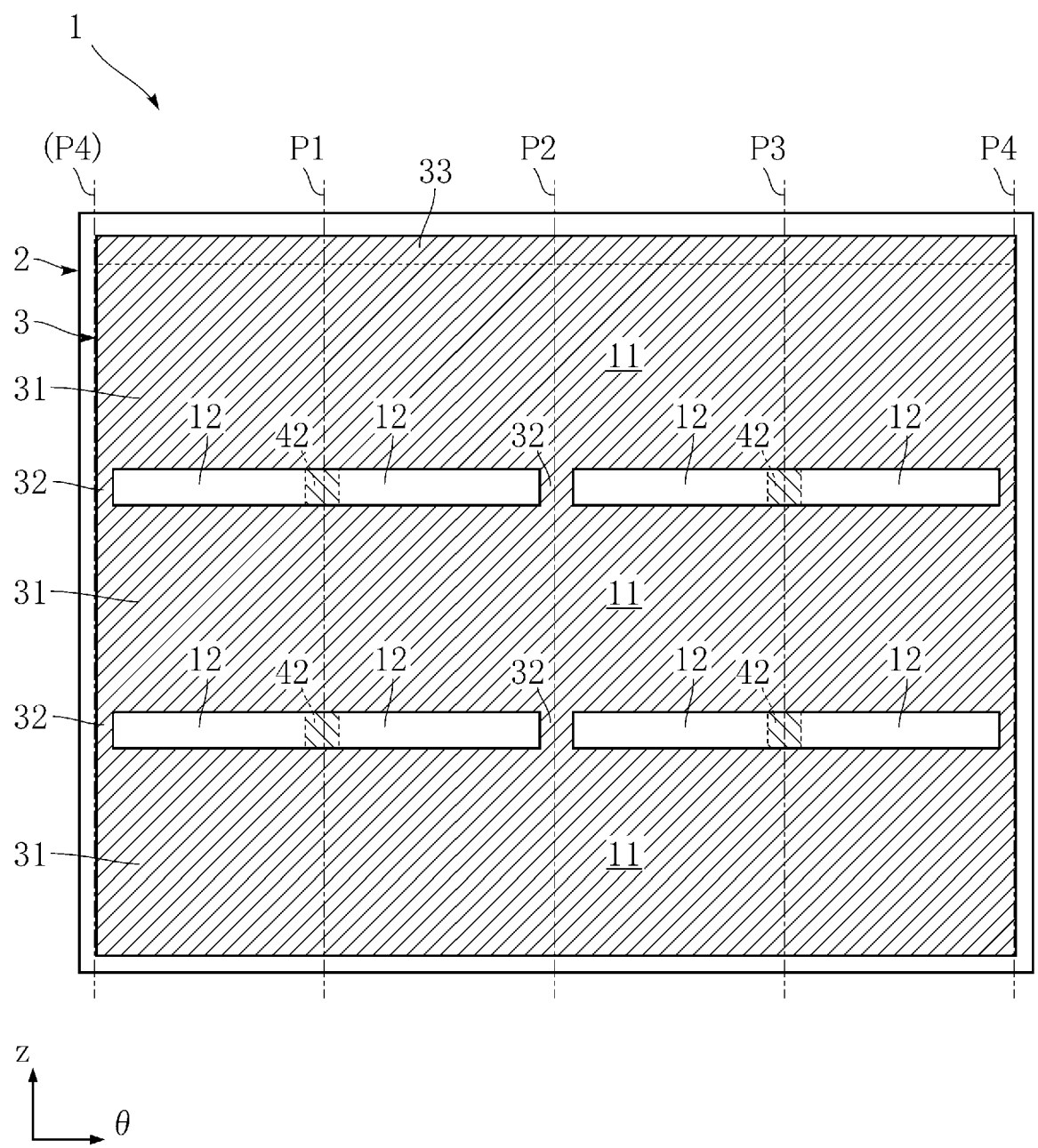
FIG. 8 is a plan view of development of the dielectric elastomer layer and the electrode layer of the dielectric elastomer transducer according to the first embodiment.

FIG. 1 is a perspective view of the dielectric elastomer transducer A1 and the dielectric elastomer driving device B1. FIG. 2 is a plan view of the dielectric elastomer transducer A1 and the dielectric elastomer driving device B1. FIG. 3 is a sectional view taken along line in FIG. 2. FIG. 4 is an enlarged sectional view of a main part illustrating a part indicated as IV in FIG. 3. FIG. 5 is an enlarged sectional view of a main part, taken along line V-V in FIG. 3. FIGS. 6 to 8 are plan views of development of a dielectric elastomer layer and an electrode layer of the dielectric elastomer transducer.

The dielectric elastomer transducer A1 includes a dielectric elastomer function element 1, a plurality of supporting bodies 5, and a tensile force maintaining body 6. The dielectric elastomer function element 1 includes a dielectric elastomer layer 2 and a pair of electrode layers 3, 4. The dielectric elastomer function element 1 can carry out an operation of a so-called artificial muscle.

Considering that the dielectric elastomer function element 1 is used as an artificial muscle for example, the dielectric elastomer layer 2 needs to be elastically deformable and high in insulation strength. The material of the dielectric elastomer layer 2 is not specifically limited, but may be a silicone elastomer or an acrylic elastomer, as a preferable example.

The dielectric elastomer layer 2 is interposed between the electrode layers 3, 4. A voltage is applied from the power source unit 7 to the electrode layers 3, 4. The electrode layers 3, 4 are formed of a material that has conductivity and can be elastically deformed in accordance with the elastic deformation of the dielectric elastomer layer 2. An example of such a material is a material in which a filler that applies conductivity is mixed in an elastically deformable main material. A preferable example of the filler described above is carbon nanotube. In the embodiment, the electrode layer 3 is provided on an outer surface of the cylindrical dielectric elastomer layer 2 and the electrode layer 4 is provided on an inner surface of the dielectric elastomer layer 2.

Suppose the dielectric elastomer function element 1 does not receive an external force from outside and is not restrained. In such a case, when a voltage from the power source unit 7 is not applied, the dielectric elastomer function element 1 is in a natural length state in which there is no voluntary expansion or contraction. In a case where an external force is applied, elastic deformation of the dielectric elastomer layer 2 is allowed. When a voltage from the power source unit 7 is applied, a positive charge and a negative charge are accumulated in the electrode layers 3, 4, with the dielectric elastomer layer 2 interposed therebetween. With the Coulomb force of the charges, the electrode layers 3, 4 are attracted to each other and the dielectric elastomer layer 2 is compressed in a thickness direction. In accordance with the compression in the thickness direction, the size of the dielectric elastomer layer 2 viewed in the thickness direction is expanded. In this way, the dielectric elastomer function element 1 can behave in a way in which the size of the dielectric elastomer function element 1 viewed in the thickness direction is expanded when a voltage is applied. The dielectric elastomer function element is not limited to a configuration in which the size of the dielectric elastomer function element viewed in the thickness direction is expanded when a voltage is applied. A configuration in which the size of the dielectric elastomer function element viewed in the thickness direction is reduced when a voltage is applied may be adopted.

FIGS. 6 to 8 illustrate the state of the dielectric elastomer layer 2 and the electrode layers 3, 4 before the dielectric elastomer transducer A1 is formed. In FIGS. 6 to 8, positions corresponding to positions P1, P2, P3, P4 that are specific positions in a circumferential direction θ illustrated in FIG. 1 are indicated by long dashed short dashed lines.

FIG. 6 is a plan view of a surface that is an outer surface of the dielectric elastomer layer 2 in the dielectric elastomer transducer A1. As illustrated in FIG. 6, the electrode layer 3 of the embodiment includes a plurality of application portions 31, a plurality of coupling portions 32, and a connecting portion 33.

The application portions 31 are portions that sandwich the dielectric elastomer layer 2 with the corresponding portions of the electrode layer 4 in the dielectric elastomer function element 1 and are the portions to which a voltage is applied. The shape of the application portions 31 is not specifically limited. In the illustrated example, the application portions 31 have a long rectangular shape that is extended long in the circumferential direction θ. The application portions 31 are arranged at intervals in an axial direction z. The number of application portions 31 is not specifically limited. In the illustrated example, a case in which there are three application portions 31 is shown. The number of application portions 31 may be two or may be equal to or more than four.

The coupling portion 32 couples together the application portions 31 that are adjacent in the axial direction z and conductively connects the adjacent application portions 31. In the illustrated example, six coupling portions 32 are provided. Among the six coupling portions 32, positions of the coupling portions 32 in the axial direction z are aligned in three. The coupling portions 32 are positioned in the position P2 and the position P4.

The connecting portion 33 is a portion that extends upward in the axial direction z from the application portion 31 positioned on an upper side in the axial direction z. As illustrated in FIG. 3, the connecting portion 33 is a portion to which a wiring 71 that configures a voltage application circuit from the power source unit 7 is connected.

FIG. 7 is a plan view of a surface that is an inner surface of the dielectric elastomer layer 2 in the dielectric elastomer transducer A1. As illustrated in FIG. 7, the electrode layer 4 of the embodiment includes a plurality of application portions 41, a plurality of coupling portions 42, and a connecting portion 43.

The application portions 41 are portions that sandwich the dielectric elastomer layer 2 with the application portions 31 of the electrode layer 3 in the dielectric elastomer function element 1 and are the portions to which a voltage is applied. The shape of the application portions 41 is not specifically limited. In the illustrated example, the application portions 41 have a long rectangular shape that is extended long in the circumferential direction θ. The application portions 41 are arranged at intervals in the axial direction z. The number of application portions 41 is not specifically limited. In the illustrated example, a case in which there are three application portions 41 is shown. The number of application portions 41 may be two or may be equal to or more than four.

The coupling portion 42 couples together the application portions 41 that are adjacent in the axial direction z and conductively connects the adjacent application portions 41. In the illustrated example, four coupling portions 42 are provided. Among the four coupling portions 42, positions of the coupling portions 42 in the axial direction z are aligned in two. The coupling portions 42 are positioned in the position P1 and the position P3, and have different positions in the circumferential direction θ from the coupling portions 32 of the electrode layer 3.

The connecting portion 43 is a portion that extends downward in the axial direction z from the application portion 41 positioned on a lower side in the axial direction z. The position of the connecting portion 43 is on the opposite side from that of the connecting portion 33 of the electrode layer 3, in the axial direction z. As illustrated in FIG. 3, the connecting portion 43 is a portion to which a wiring 72 that configures the voltage application circuit from the power source unit 7 is connected.

FIG. 8 indicates a part of the electrode layer 4 by a shadow line that overlaps with the dielectric elastomer layer 2 and the electrode layer 3. As illustrated in FIG. 8, the dielectric elastomer function element 1 is configured of a plurality of function portions 11 and a plurality of electrode-less portions 12.

Each function portion 11 is configured of the application portion 31 of the electrode layer 3, the application portion 41 of the electrode layer 4, and a portion of the dielectric elastomer layer 2 interposed between the application portion 31 and the application portion 41. That is, the portion of the dielectric elastomer layer 2 that configures the function portion 11 is a portion that is notably deformed when a voltage is applied to the application portion 31 and the application portion 41. In the illustrated example, three function portions 11 aligned in the axial direction z are provided.

The electrode-less portions 12 are configured of portions of the dielectric elastomer layer 2 on which both the electrode layer 3 and the electrode layer 4 are not formed. The electrode-less portions 12 are positioned between the function portions 11 that are adjacent in the axial direction z. In the illustrated example, eight electrode-less portions 12 are provided.

The supporting bodies 5 are for maintaining the dielectric elastomer function element 1 in a tubular shape. In the embodiment, the supporting bodies 5 are configured to maintain the dielectric elastomer function element 1 in a cylindrical shape, are plate members that have a circular shape when viewed in the axial direction z, and each have an outer peripheral surface 51. The number of the supporting bodies 5 is not specifically limited. In the embodiment, four supporting bodies 5 are provided corresponding to the three function portions 11 being arranged in the axial direction z. The configuration of the supporting bodies 5 is not specifically limited, and only needs to be a configuration that supports the dielectric elastomer function element 1 in a desired state. The supporting bodies 5 may have an elliptic shape or a polygonal shape etc. In such cases, the dielectric elastomer function element 1 will have an elliptic tubular shape or a polygonal tubular shape. The dielectric elastomer function element 1 may have a frame-like shape or may be a skeleton structure besides the plate shape.

As illustrated in FIG. 3, the two supporting bodies 5 that are positioned on the upper end and the lower end in the axial direction z do not have large through holes. The two supporting bodies 5 that are positioned on an inner side in the axial direction z have through holes 52. The through holes 52 are extended through the supporting bodies 5 in the axial direction z and are positioned in the center of the supporting bodies 5 when viewed in the axial direction z. The supporting bodies 5 may have recessed portions 53. In the illustrated example, two recessed portions 53 are formed at the position P1 and the position P3. The recessed portions 53 are recessed radially inward from the outer peripheral surfaces 51.

The tensile force maintaining body 6 maintains tensile force that causes the dielectric elastomer function element 1 to expand in the axial direction z. The detailed configuration of the tensile force maintaining body 6 is not specifically limited. In the embodiment, the tensile force maintaining body 6 is configured of a spring. As illustrated in FIG. 3, ends of the tensile force maintaining body 6 are attached to the two supporting bodies 5 that are positioned on the upper end and the lower end in the axial direction z. The tensile force maintaining body 6 is inserted in the through holes 52 of the two supporting bodies 5 that are positioned on an inner side in the axial direction z.

In the embodiment, the dielectric elastomer function element 1 is joined to the four supporting bodies 5 so as to maintain the dielectric elastomer function element 1 in a cylindrical shape. The dielectric elastomer function element 1 illustrated in FIGS. 6 to 8 is wound around the supporting bodies 5 so as to form a cylindrical shape. In the embodiment, the dielectric elastomer function element 1 has a single sheet cylindrical shape without overlapping. More specifically, the dielectric elastomer function element 1 is configured so that at least the function portion 11 is a single sheet without overlapping. That is, the configuration may be such that when the dielectric elastomer function element 1 illustrated in FIGS. 6 to 8 is wound around the supporting bodies 5, the portions of the dielectric elastomer function element 1 in the circumferential direction θ other than the function portion 11 slightly overlap with each other.

The dielectric elastomer function element 1 is joined to the outer peripheral surfaces 51 of the four supporting bodies 5. More specifically, as illustrated in FIG. 5, an inner surface of the electrode-less portion 12 of the dielectric elastomer function element 1 is joined to the outer peripheral surface 51 of the supporting body 5 with joining members 29. As illustrated in FIG. 4, a part of the dielectric elastomer layer 2 on which the electrode layer 3 is provided on the outer surface and the electrode layer 4 is not provided on the inner surface is joined to the outer peripheral surface 51 of the supporting body 5 with the joining member 29. In contrast, as illustrated in FIGS. 3 and 4, the application portions 41 that configure the function portions 11 are spaced away from the supporting bodies 5 in the axial direction z. The application portions 41 (function portions 11) are thus not joined to the supporting bodies 5 and are spaced away from the supporting bodies 5 in the axial direction z.

The coupling portions 42 of the electrode layer 4 are not joined to the supporting bodies 5. In the embodiment, as illustrated in FIG. 5, a recessed portion 53 is formed on each supporting body 5 at the position P1 and the position P3 where the coupling portion 42 is present. The positions of the coupling portion 42 and the recessed portion 53 are matched in the circumferential direction θ so that the coupling portion 42 is clearly spaced away from the supporting body 5. The configuration is not limited to the configuration in which the recessed portion 53 is provided so that the coupling portion 42 is spaced away from the supporting body 5. A supporting body 5 that is not provided with the recessed portion 53 may be used. Even in such a case, it is preferable that the electrode-less portion 12 be joined to the outer peripheral surface 51 with the joining member 29 and the coupling portion 42 not be joined to the outer peripheral surface 51 of the supporting body 5.

As illustrated in FIG. 3, the tensile force maintaining body 6 is provided inside the dielectric elastomer function element 1 that has a cylindrical shape. The dielectric elastomer function element 1 and the tensile force maintaining body 6 are not in contact and are spaced away from each other in the radial direction r. In the illustrated state, a voltage from the power source unit 7 is not applied. In FIG. 3, the tensile force maintaining body 6 is compressed in the axial direction z with respect to the natural length and an elastic force of expanding in the axial direction z and returning to the natural length is being exerted by the tensile force maintaining body 6. The elastic force of the tensile force maintaining body 6 is applied to both ends of the dielectric elastomer function element 1 in the axial direction z via the two supporting bodies 5. In this way, the tensile force of expanding in the axial direction z is maintained in the dielectric elastomer function element 1. With the tensile force being maintained, the dielectric elastomer function element 1 is expanded in the axial direction z and has shape that is a slightly constricted between the supporting bodies 5 that are adjacent in the axial direction z. In the illustrated example, a diameter of the supporting body 5 is similar to a distance between the supporting bodies 5 that are adjacent in the axial direction z or is smaller than such a distance. The dielectric elastomer function element 1 that is positioned between the adjacent supporting bodies 5 thus has a cylindrical shape with a relatively short axis. The constriction of the dielectric elastomer function element 1 described above is prominently smaller than a constriction in a case where the dielectric elastomer function element 1 is set to have a cylindrical shape with only the two supporting bodies 5 at the upper end and the lower end in the axial direction z and an equivalent tensile force is maintained.

The functions of the dielectric elastomer transducer A1 and the dielectric elastomer driving device B1 will be described.

In the embodiment, each electrode-less portion 12 is fixed to the supporting body 5 and each function portion 11 is spaced away from the supporting body 5, as illustrated in FIG. 3. The function portion 11 is a portion that is expanded and contracted in accordance with application of a voltage from the power source unit 7. If the function portion 11 is joined to the supporting body 5, expansion and contraction of the function portion 11 is unreasonably restricted by the supporting body 5. Sufficient expansion and contraction are thus obstructed. If the application portion 41 is joined to the supporting body 5, excessive stress is generated in the application portion 41 and the application portion 41 may be damaged. Since the function portion 11 is spaced away from the supporting body 5 in the embodiment, there is no possibility of expansion and contraction of the function portion 11 being obstructed and its sufficient expansion and contraction can be expected. Both the application portion 31 and the application portion 41 that configure the function portion 11 are not joined to the supporting body 5. In this way, it is possible to avoid generation of excessive stress in the application portion 31 and the application portion 41. It is also possible to suppress the application portion 31 and the application portion 41 from being damaged. With the dielectric elastomer transducer A1 and the dielectric elastomer driving device B1, it is thus possible to avoid damaging the electrode layers 3, 4 and acquire a sufficient amount of expansion.

Since the function portions 11 form a plurality of stages in the axial direction z in the configuration, it is possible to relatively decrease the size of each function portion 11 in the axial direction z. It is thus possible to decrease the amount of constriction in conjunction with the tensile force of the dielectric elastomer function element 1, and effectively expand and contract the dielectric elastomer transducer A1. Since the dielectric elastomer function element 1 is a single sheet without overlapping, it is possible to prevent the electrode layer 3 and the electrode layer 4 from being rubbed against each other due to the function portions 11 overlapping.

As illustrated in FIGS. 4 and 5, each portion of the dielectric elastomer function element 1 that is joined to the outer peripheral surface 51 of the supporting body 5 is a part of the dielectric elastomer layer 2. The electrode layer 4 is not joined to the supporting body 5. Even if deformation occurs in the coupling portion 42 in conjunction with the expansion and contraction of the dielectric elastomer transducer A1, it is possible to prevent the supporting body 5 from restricting the deformation. This is preferable for the protection of the electrode layer 4.

As illustrated in FIGS. 6 to 8, the coupling portion 32 of the electrode layer 3 and the coupling portion 42 of the electrode layer 4 at positions that are different from each other in the circumferential direction θ. In a region where the supporting body 5 is present in the axial direction z, there is no structure in which both the electrode layer 3 and the electrode layer 4 sandwich the same portion of the dielectric elastomer layer 2. That is, a portion that is structured by only the dielectric elastomer layer 2 or a portion that is structured by the dielectric elastomer 2 and either the electrode layer 3 or the electrode layer 4 is not deformed prominently even if a voltage is applied by the power source unit 7. It is thus possible to avoid a situation in which the part of the dielectric elastomer function element 1 that is joined to the supporting body 5 is unreasonably restricted against deformation.

Since the connecting portion 33 and the connecting portion 43 are provided on opposite sides from each other in the axial direction z, it is possible to prevent an unintended Coulomb force from being generated between the connecting portion 33 and the connecting portion 43.

FIGS. 9 to 23 illustrate modifications and other. In the figures, elements that are the same or that are similar to those of the embodiment described above are given the same symbols as those of the embodiment described above.

Figure 9:
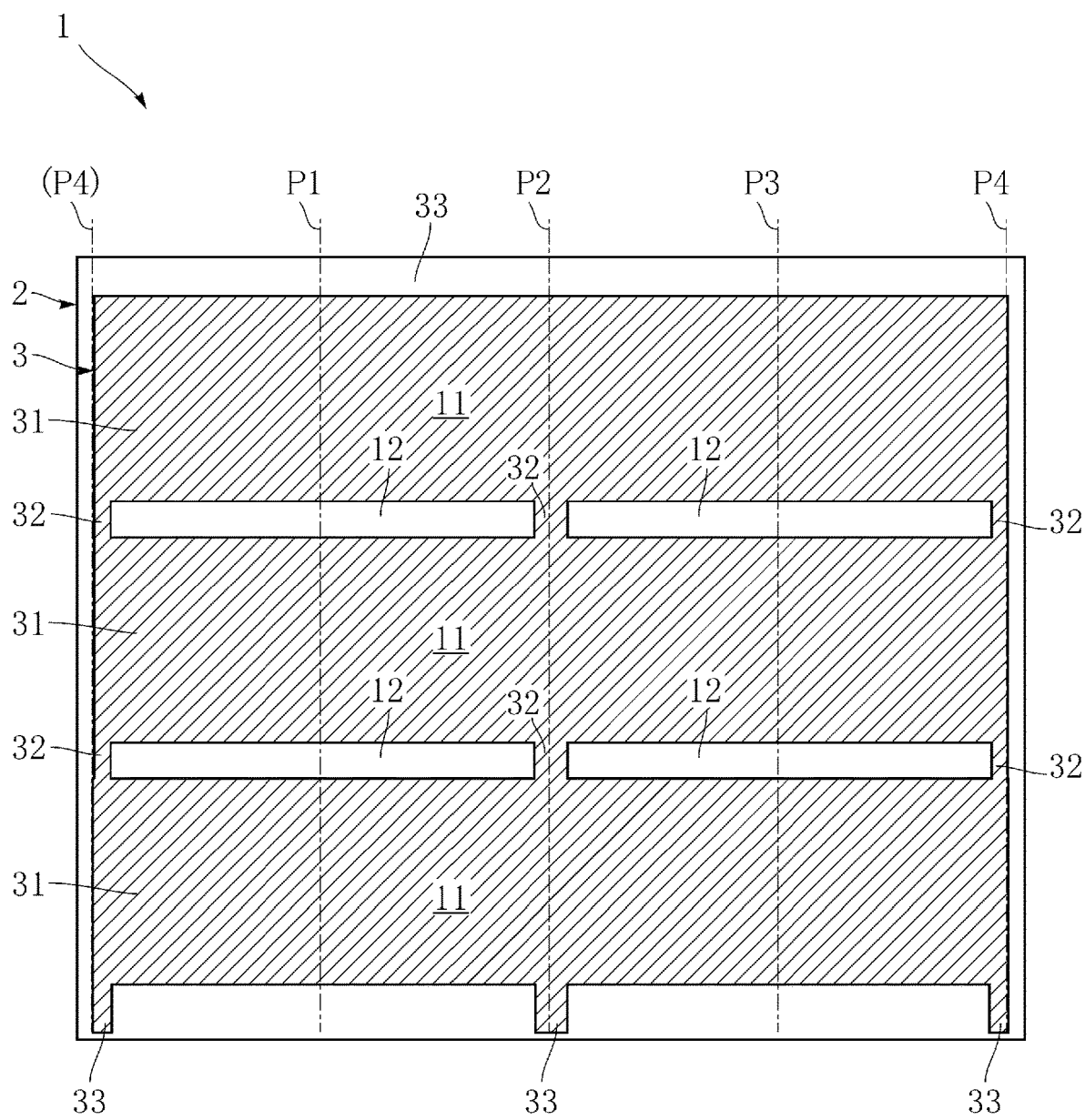
FIG. 9 is a plan view of development of a dielectric elastomer layer and an electrode layer of a dielectric elastomer transducer according to a modification of the first embodiment.
Figure 10:
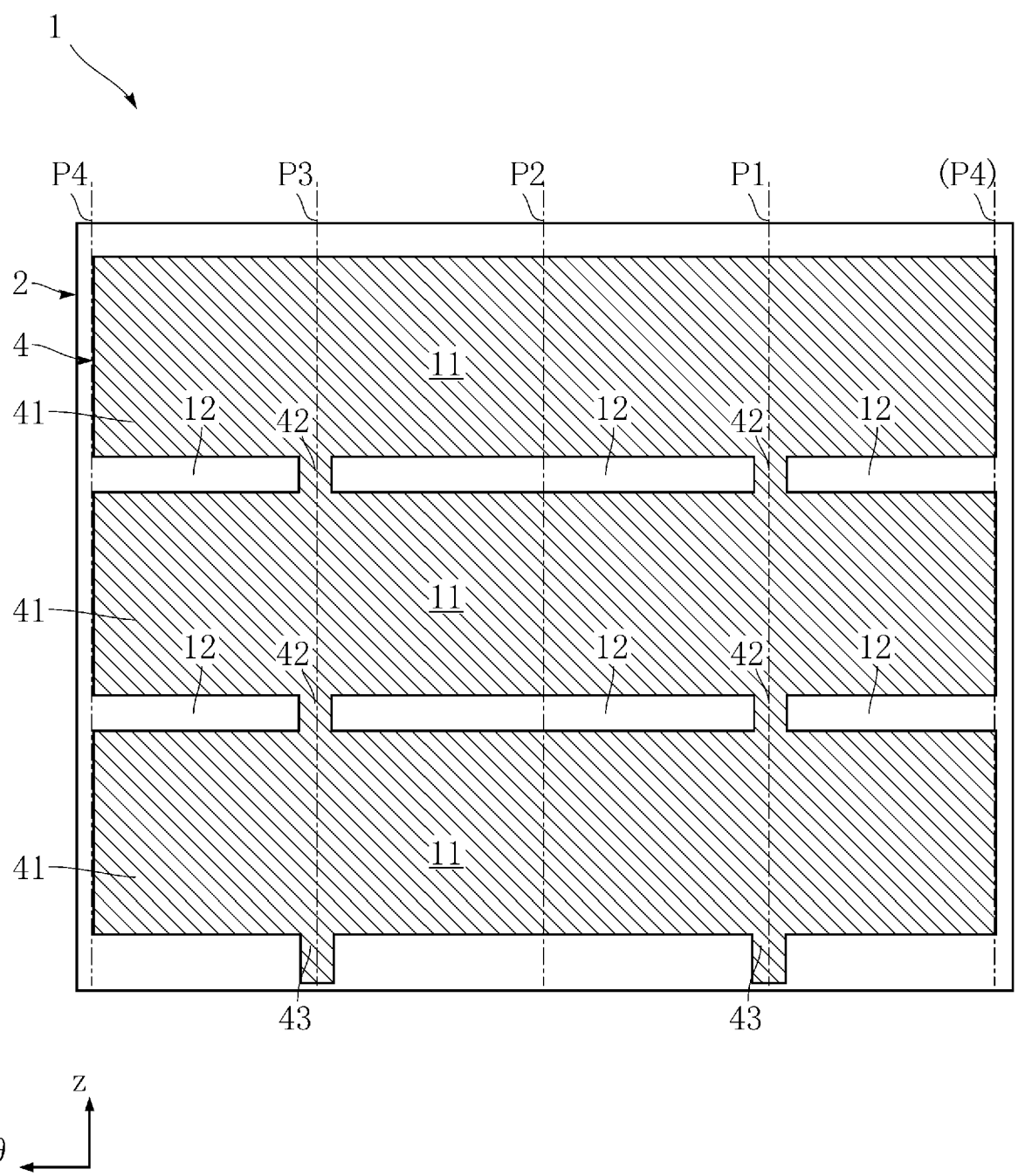
FIG. 10 is a plan view of development of the dielectric elastomer layer and an electrode layer of the dielectric elastomer transducer according to the modification of the first embodiment.

FIGS. 9 and 10 illustrate the dielectric elastomer function element 1 of a modification of the dielectric elastomer transducer A1. In the modification, the connecting portion 33 of the electrode layer 3 and the connecting portion 43 of the electrode layer 4 are provided on the same side in the axial direction z.

In the modification, a plurality of the connecting portions 33 that are spaced away from each other in the circumferential direction θ are provided, as illustrated in FIG. 9. As illustrated in FIG. 10, a plurality of the connecting portions 43 that are spaced away from each other in the circumferential direction θ are provided. The connecting portions 33 are provided at the position P2 and the position P4 and the connecting portions 43 are provided at the position P1 and the position P3. That is, the connecting portions 33 and the connecting portions 43 are provided at positions in the circumferential direction θ that are different form each other.

Even in such a modification, it is possible to avoid damaging the electrode layers 3, 4 and acquire a sufficient expansion amount.

Figure 11:
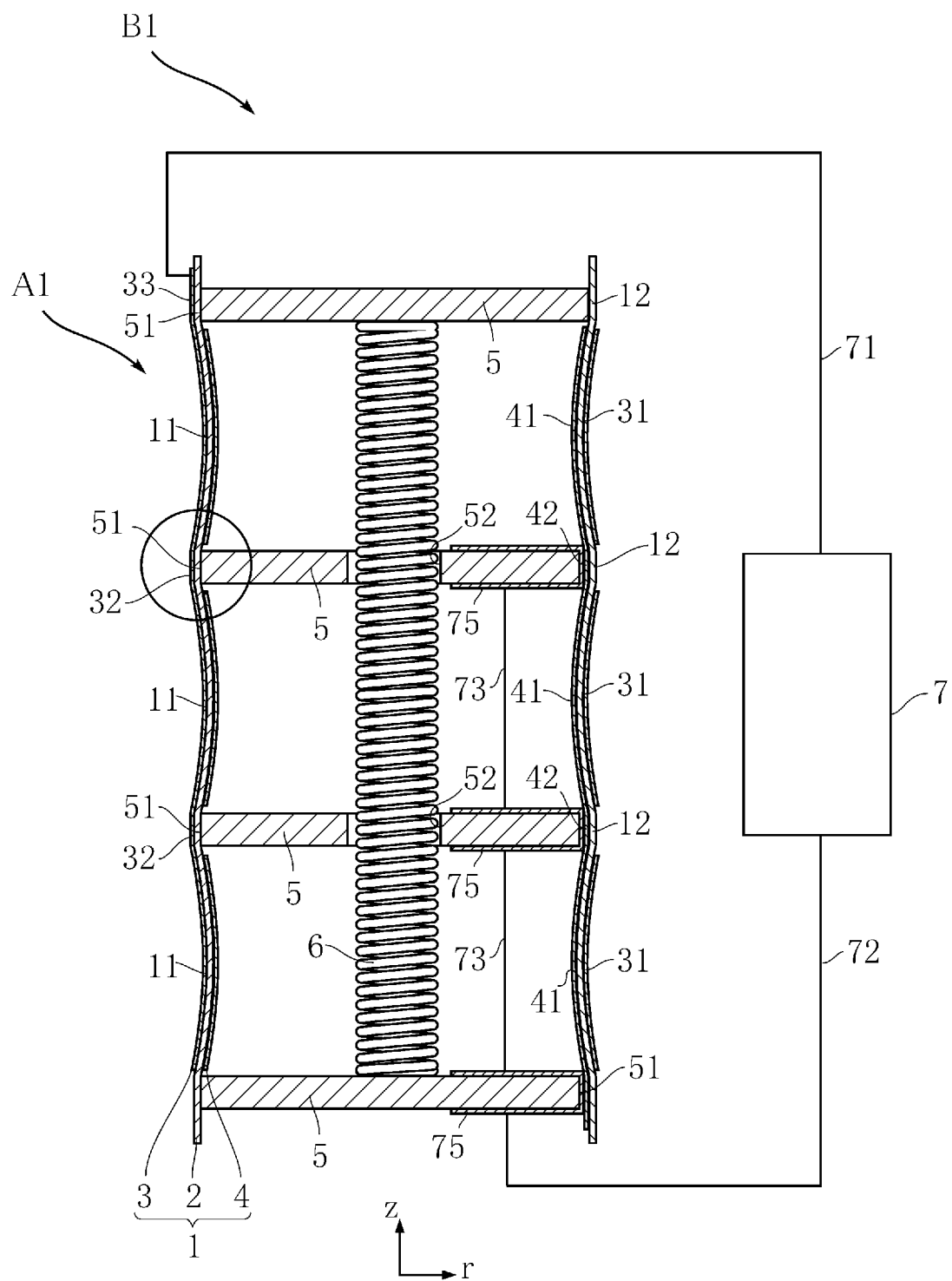
FIG. 11 is a sectional view of a dielectric elastomer transducer and a dielectric elastomer driving device of another modification according to the first embodiment.

FIG. 11 illustrates another modification of the dielectric elastomer transducer A1 and the dielectric elastomer driving device B1. In the embodiment, a plurality of wirings 73 and a plurality of metal films 75 are provided in the dielectric elastomer transducer A1. The metal films 75 are made of metal such as copper and are joined to the supporting bodies 5. Specifically, the metal films 75 have a belt shape in which the radial direction r is a longitudinal direction and the circumferential direction θ is a width direction. The metal films 75 are joined to the three supporting bodies 5 that are positioned on the lower side in the axial direction z among the four supporting bodies 5. The metal films 75 are provided along axial upper surfaces, axial lower surfaces, and the outer peripheral surfaces 51 of the supporting bodies 5. The wirings 73 are connected to the metal films 75 that are provided on the adjacent supporting bodies 5 and are configured so as to conductively connect with a low resistance the adjacent metal films 75. Portions of the metal films 75 that cover the outer peripheral surfaces 51 are conductively connected to the coupling portions 42 of the electrode layer 4.

Even in such a modification, it is possible to avoid damaging the electrode layers 3, 4 and acquire a sufficient expansion amount. The conduction paths are formed by the wirings 73 and the metal films 75. In the application portions 41, the conduction paths that pass through the wirings 73 and the metal films 75 are thus formed in addition to conduction paths that pass through the adjacent application portions 41. The conduction paths that pass through the wirings 73 and the metal films 75 can be set to have a lower resistance than the conduction paths that pass through the application portions 41. It is thus possible to expand and contract the entire dielectric elastomer function element 1 more effectively. Supplying electrical charge to the dielectric elastomer function element 1 and removing electrical charge from the dielectric elastomer function element 1 can also be completed in a shorter amount of time. It is thus possible to increase the operation speed of the dielectric elastomer transducer A1. Besides the configuration of the modification, a conduction path to the dielectric elastomer function element 1 may be formed by the tensile force maintaining body 6 instead of the wirings 73. For example, it is possible to configure the conduction path described above by forming at least a surface of the tensile force maintaining body 6 with a conductor and making the tensile force maintaining body 6 be in contact with the metal films 75.

The configuration of the modification illustrated in FIGS. 9 to 11 can also be adopted to the following embodiments.

Figure 12:
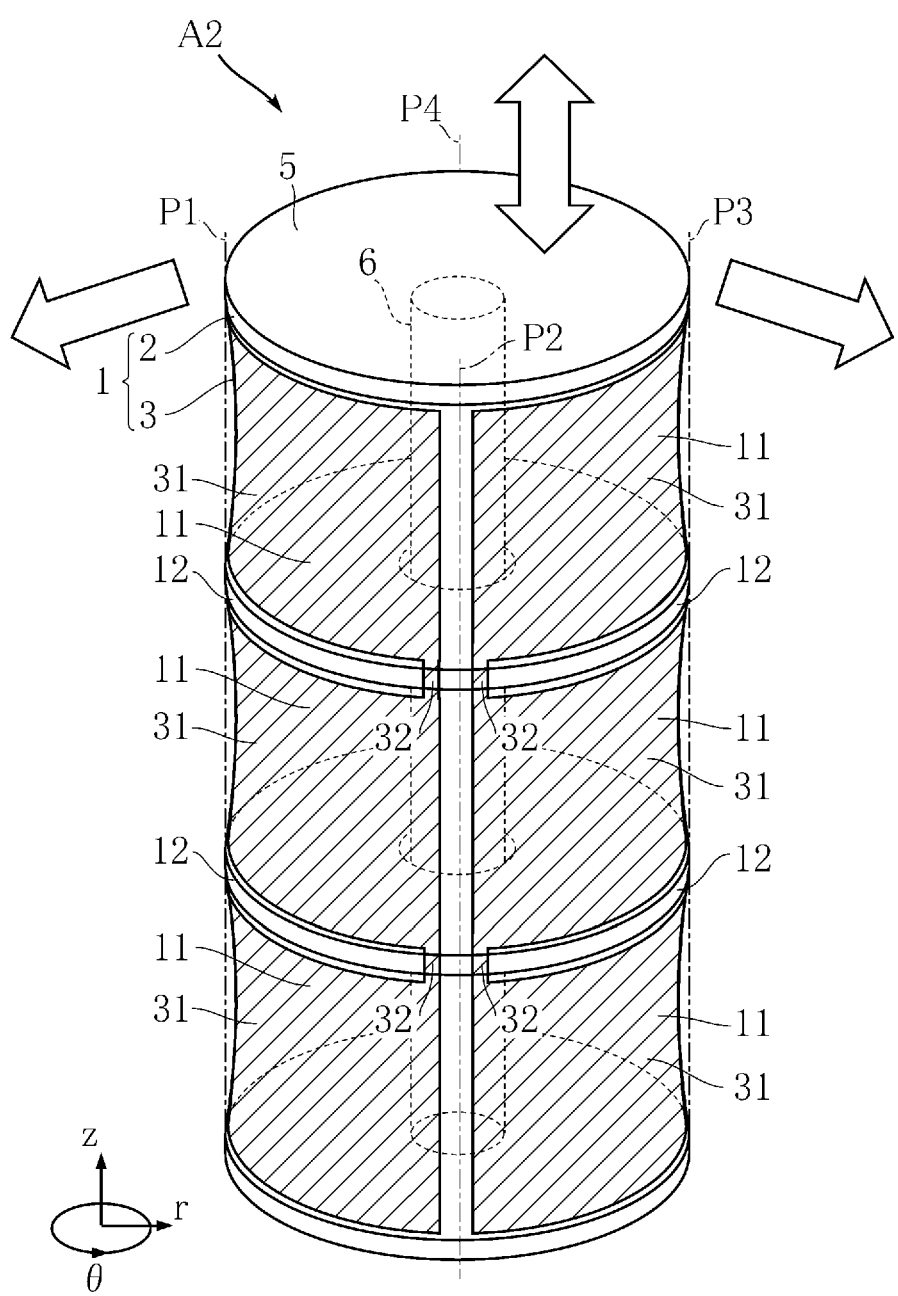
FIG. 12 is a perspective view of a dielectric elastomer transducer and a dielectric elastomer driving device according to a second embodiment.
Figure 13:
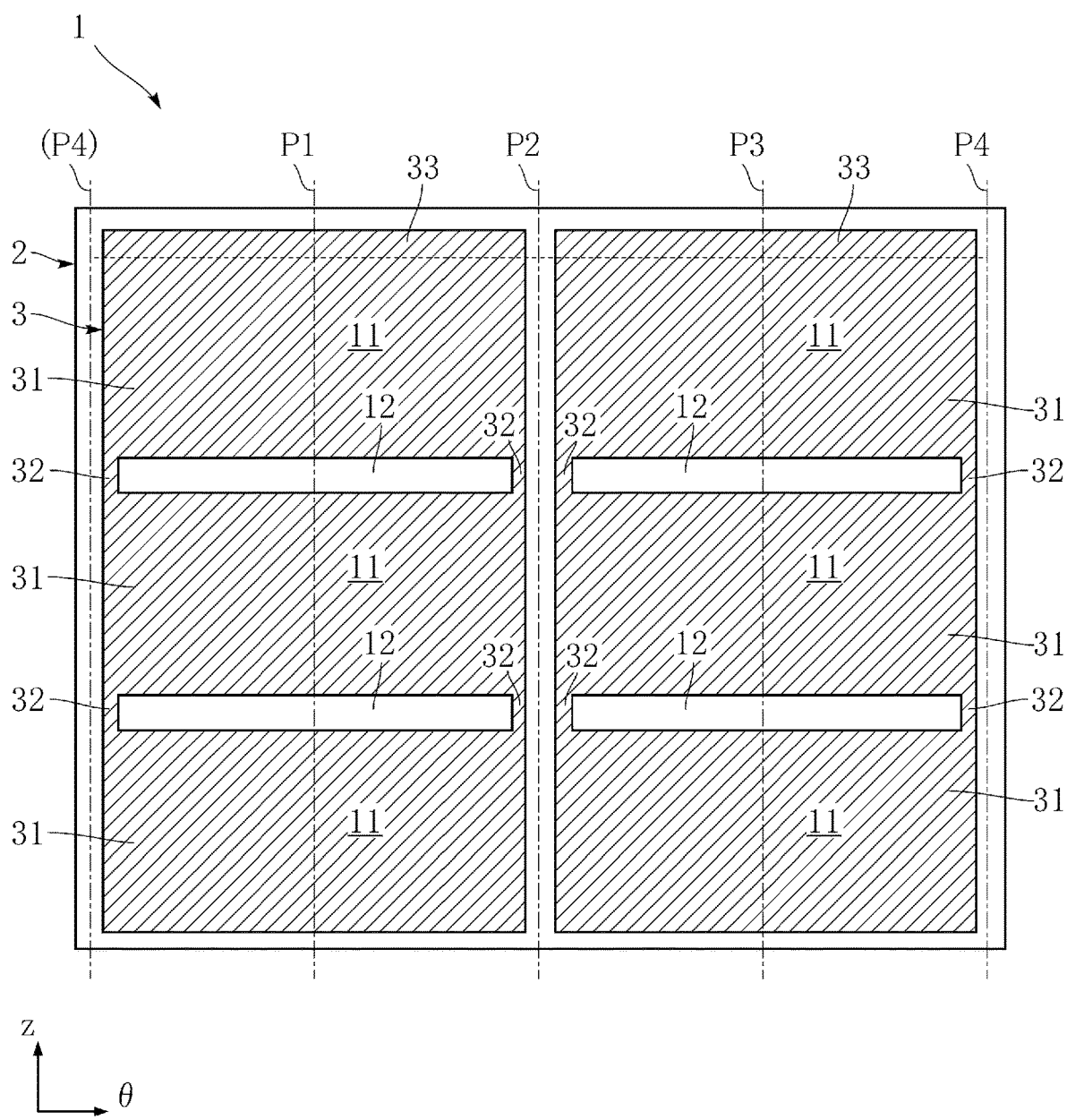
FIG. 13 is a plan view of development of a dielectric elastomer layer and an electrode layer of the dielectric elastomer transducer according to the second embodiment.
Figure 14:
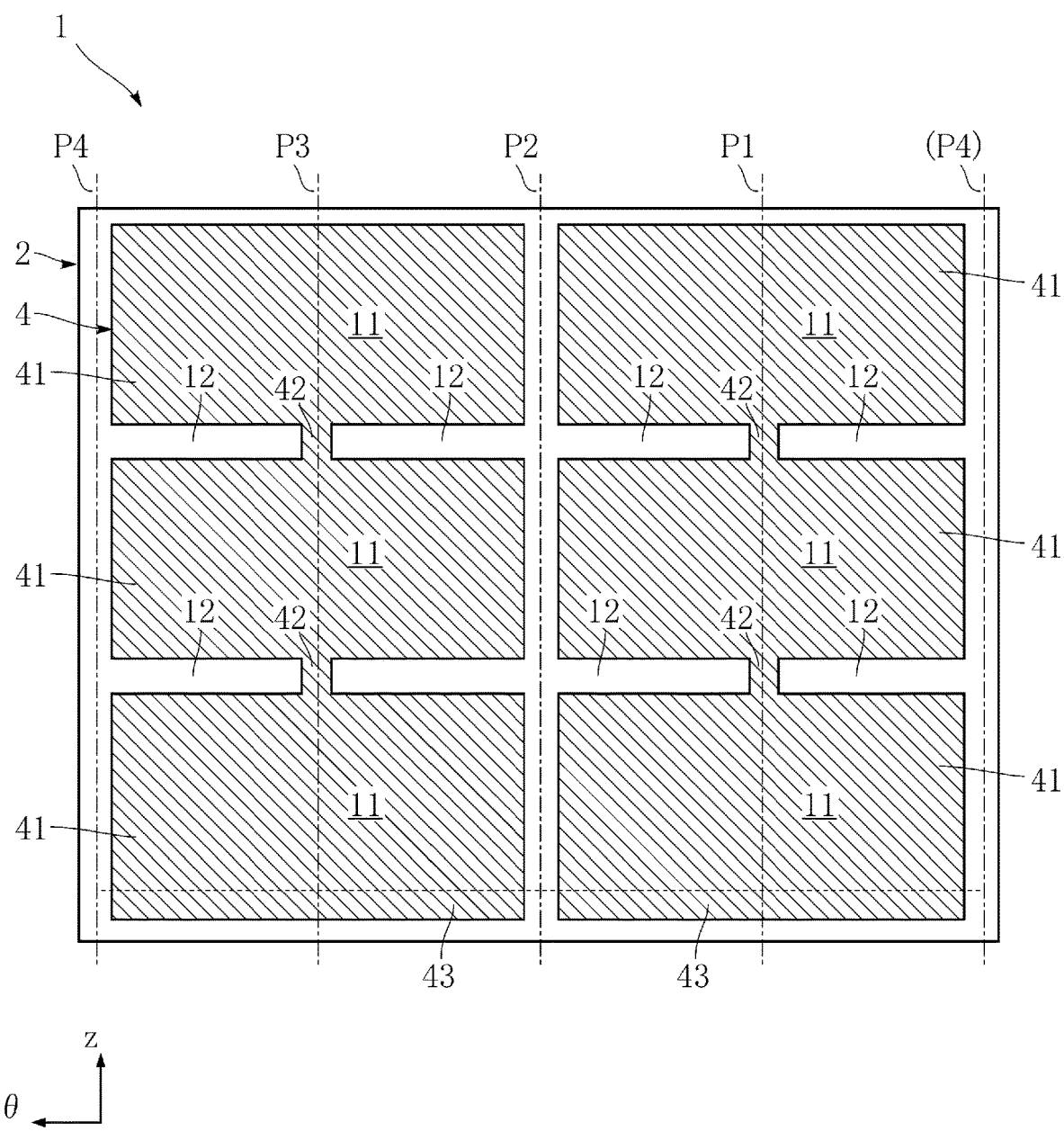
FIG. 14 is a plan view of development of the dielectric elastomer layer and an electrode layer of the dielectric elastomer transducer according to the second embodiment.

FIGS. 12 to 14 illustrate a dielectric elastomer transducer of a second embodiment. In the dielectric elastomer transducer A2 of the embodiment, the electrode layer 3 has six application portions 31. The application portions 31 are disposed in two while each of the two application portions 31 is spaced away from the other application portion 31 in the circumferential direction θ. The application portions 31 that are adjacent to each other in the axial direction z are coupled by the coupling portion 32. As illustrated in FIG. 14, the electrode layer 4 has six application portions 41. The application portions 41 are disposed in two while each of the two application portions 41 is spaced away from the other application portion 41 in the circumferential direction θ. The application portions 41 that are adjacent to each other in the axial direction z are coupled by the coupling portion 42. With the above configuration of the electrode layer 3 and the electrode layer 4, the dielectric elastomer function element 1 has six function portions 11. The function portions 11 are disposed in two while each of the two function portions 11 is spaced away from the other function portion 11 in the circumferential direction θ. The function portions 11 are disposed in three, in which the groups of three are separated in the circumferential direction θ with the position P2 and the position P4 interposed therebetween. Similar to the embodiment described above, the electrode-less portion 12 is provided between the function portions 11 that are adjacent to each other in the axial direction z.

In the embodiment, the wiring 71 illustrated in FIG. 3 is individually connected to each of the two connecting portions 33 of the electrode layer 3. The wiring 72 illustrated in FIG. 3 is individually connected to each of the two connecting portions 43 of the electrode layer 4. With this configuration, when a voltage is applied to the entirety of the electrode layer 3 and the electrode layer 4, the dielectric elastomer transducer A2 is deformed so as to be expanded in the axial direction z, as illustrated in FIG. 12. When a voltage is only applied to the connecting portions 33 and the connecting portions 43 that are positioned at the position P1, the dielectric elastomer transducer A2 is deformed so as to be bent toward the position P3. When a voltage is only applied to the connecting portions 33 and the connecting portions 43 that are positioned at the position P3, the dielectric elastomer transducer A2 is deformed so as to be bent toward the position P1.

Even with such an embodiment, it is possible to avoid damaging the electrode layers 3, 4 and acquire a sufficient amount of expansion. It is also possible to cause various types of deformation in the dielectric elastomer transducer A2 such as expansion and two types of bending through appropriately selecting the application portion 31 and the application portion 41 (function portion 11) to which a voltage is applied. A bar-shaped member that is an elastic body and that is different from a spring may be adopted as the tensile force maintaining body 6. In this case, although the tensile force of the dielectric elastomer function element 1 can be maintained, the dielectric elastomer transducer A2 is not prominently deformed even when a voltage is applied to both of the two connecting portions 33 and the two connecting portions 43. When a voltage is applied to one pair of the connecting portions 33 and the connecting portions 43, the bending deformation described above occurs.

Figure 15:
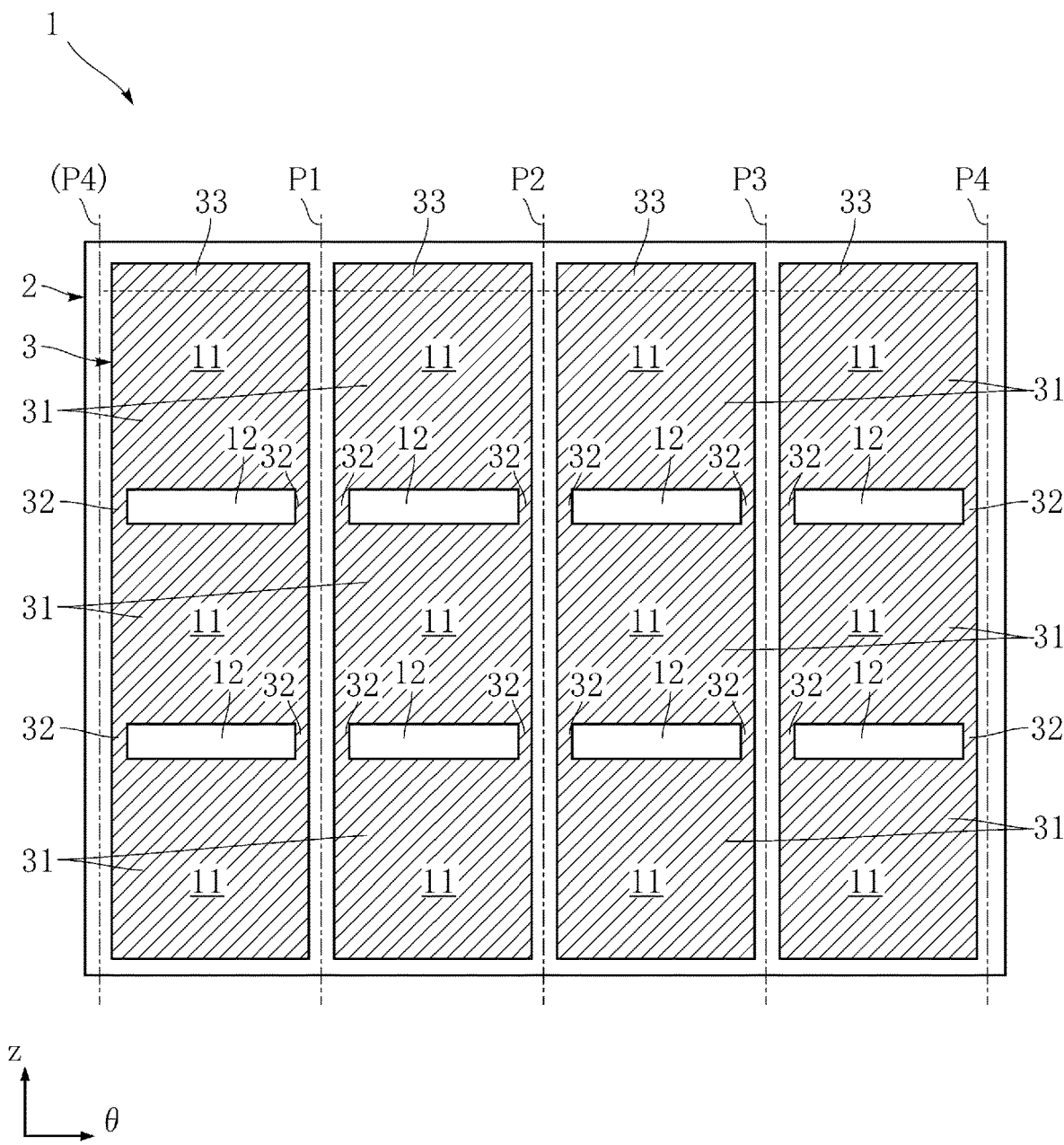
FIG. 15 is a plan view of development of a dielectric elastomer layer and an electrode layer of a dielectric elastomer transducer according to a modification of the second embodiment.
Figure 16:
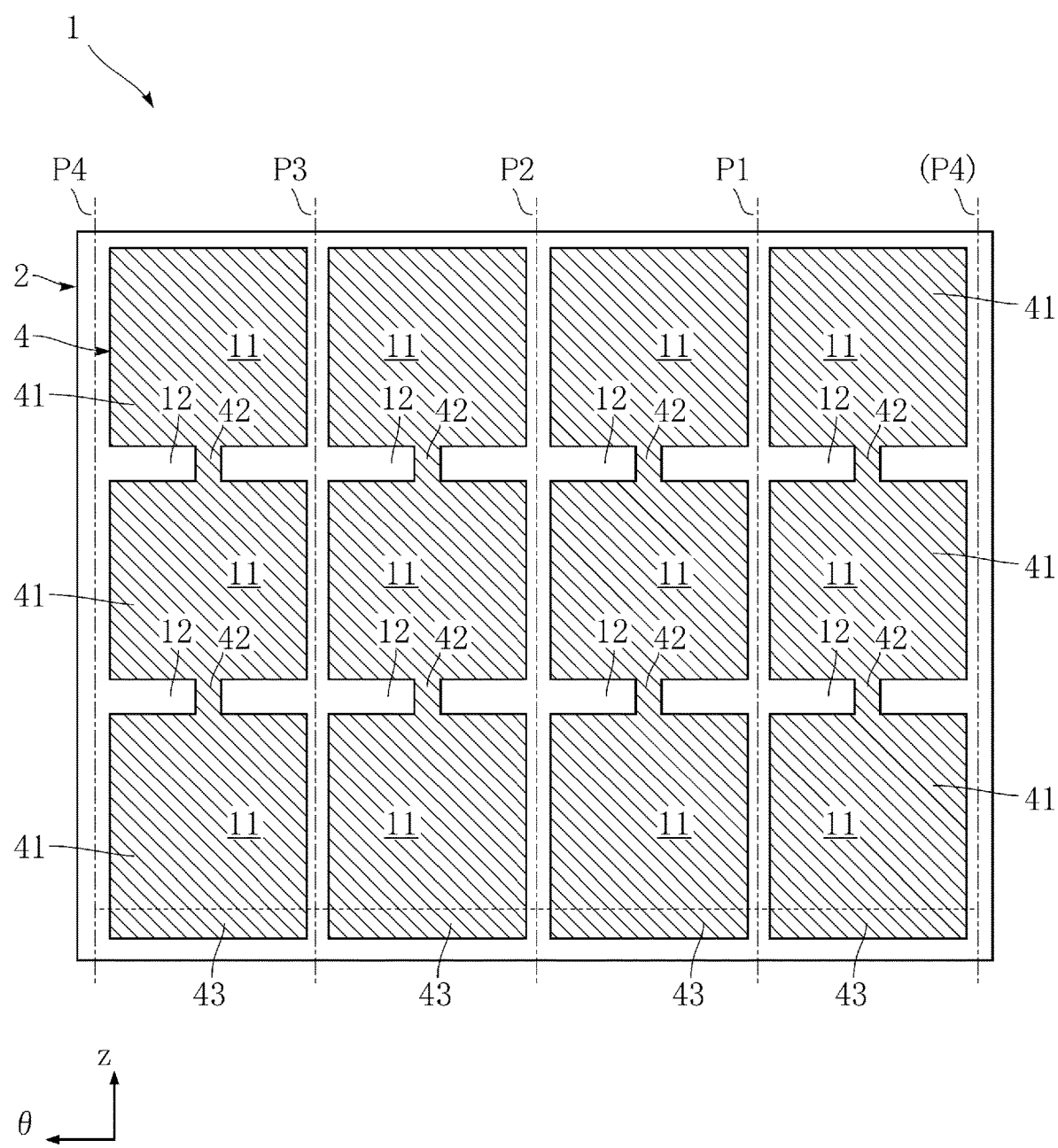
FIG. 16 is a plan view of development of the dielectric elastomer layer and an electrode layer of the dielectric elastomer transducer according to the modification of the second embodiment.

FIGS. 15 and 16 illustrate the dielectric elastomer function element 1 of a modification of the dielectric elastomer transducer A2. In the modification, the electrode layer 3 has twelve application portions 31 and the electrode layer 4 has twelve application portions 41. The application portions 31 are disposed in four while each of the four application portions 31 is spaced away from the other application portions 31 in the circumferential direction θ and the application portions 41 are disposed in four while each of the four application portions 41 is spaced away from the other application portions 41 in the circumferential direction θ. In this way, the dielectric elastomer function element 1 has twelve function portions 11 and the function portions are disposed in four while each of the four function portions 11 is spaced away in the circumferential direction θ. Four connecting portions 33 and four connecting portions 43 are provided, corresponding to the application portions 31 and the application portions 41 that are provided while being spaced away in the circumferential direction θ.

Even in such a modification, it is possible to avoid damaging the electrode layers 3, 4 and acquire a sufficient expansion amount. It is also possible to cause a deformation in which the dielectric elastomer transducer A2 bends toward the opposite side of the position at which the connecting portion 33 and the connecting portion 43 are present in the circumferential direction θ through applying a voltage to only one pair of the four connecting portions 33 and the four connecting portions 43. In the dielectric elastomer transducer A2 of the modification, it is thus able to appropriately select and cause a deformation in which the dielectric elastomer transducer A2 is bent toward four directions that are different from each other by 90 degrees.

Figure 17:
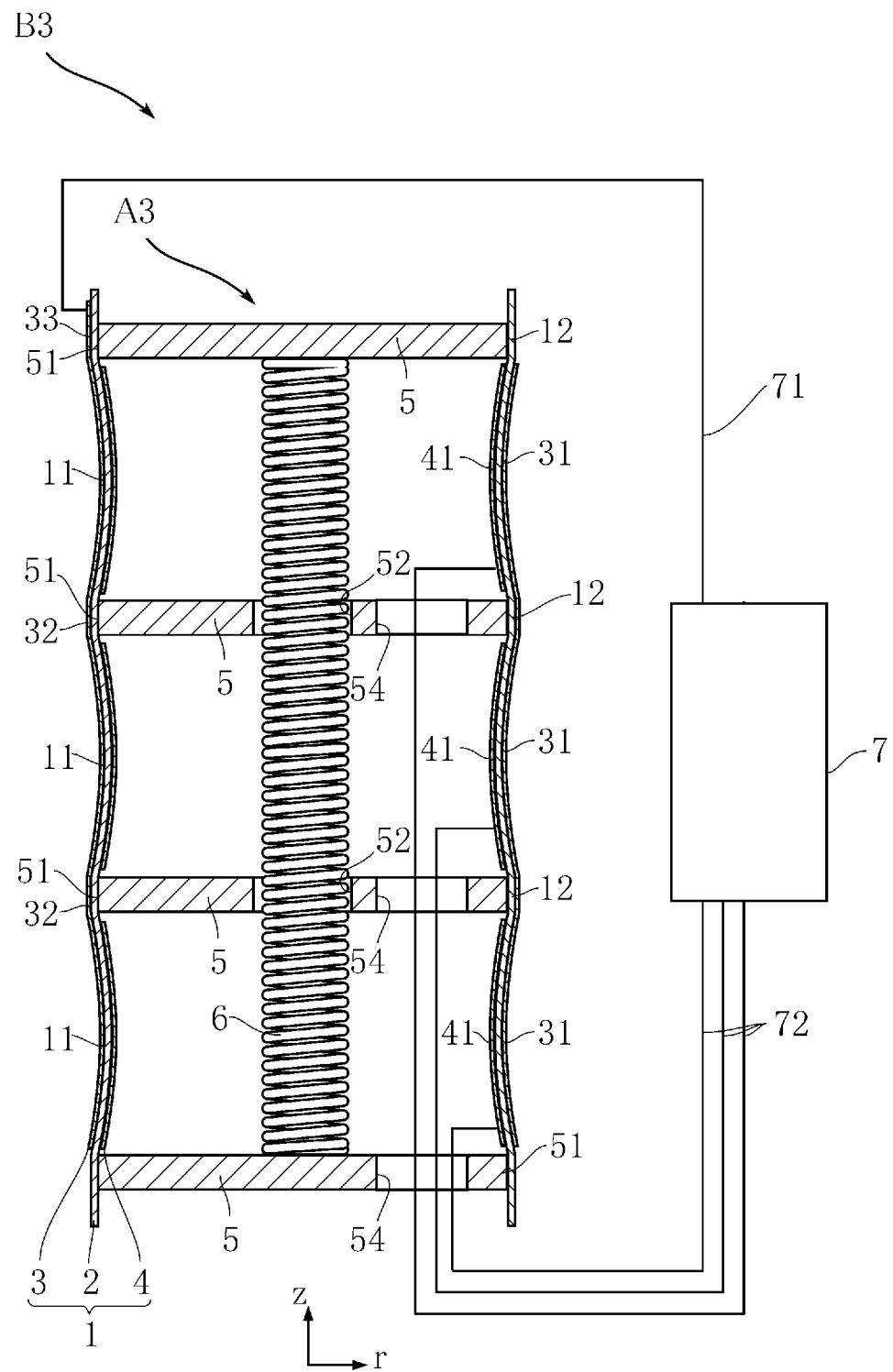
FIG. 17 is a sectional view of a dielectric elastomer transducer and a dielectric elastomer driving device according to a third embodiment.
Figure 18:
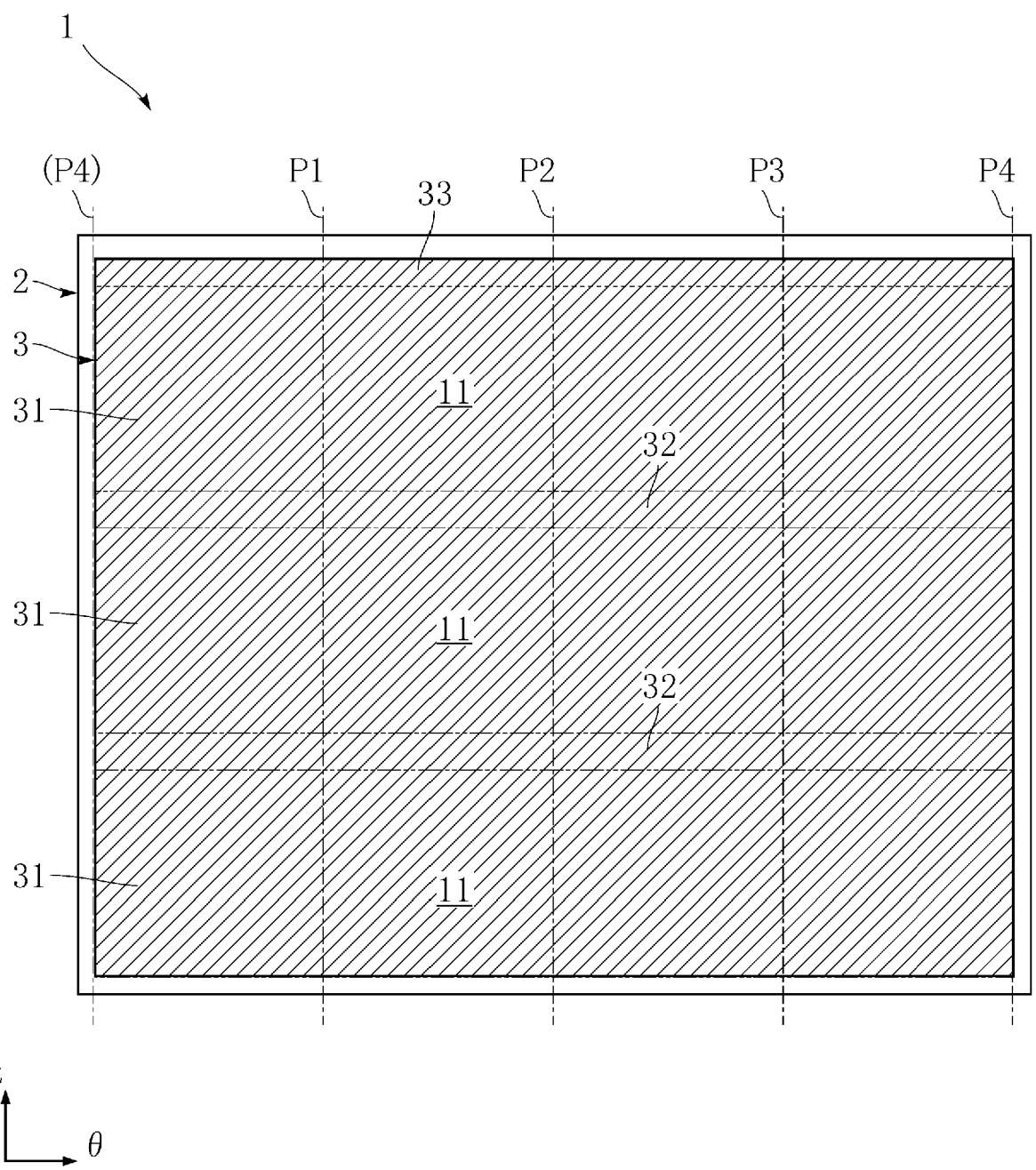
FIG. 18 is a plan view of development of a dielectric elastomer layer and an electrode layer of the dielectric elastomer transducer according to the third embodiment.
Figure 19:
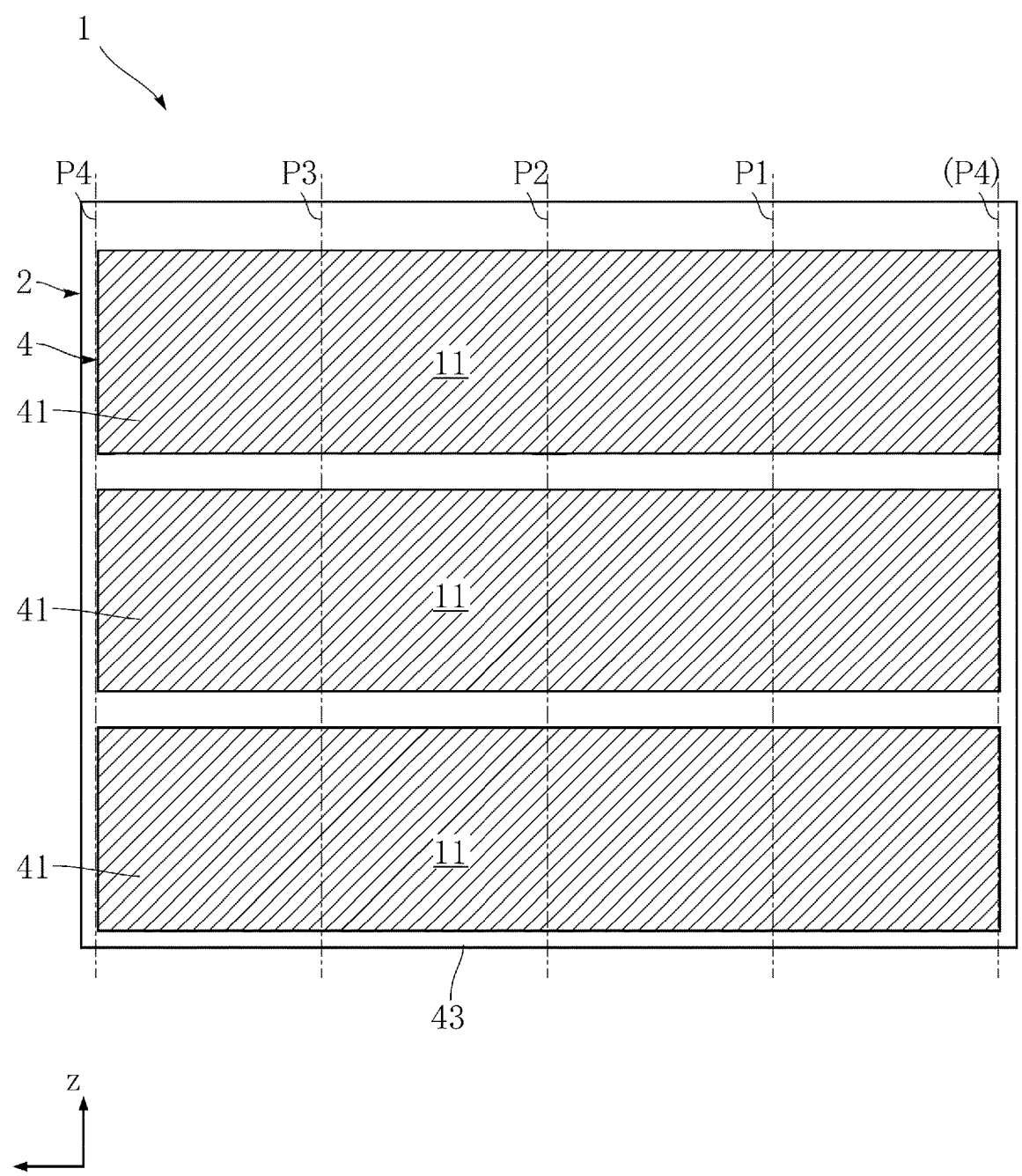
FIG. 19 is a plan view of development of the dielectric elastomer layer and an electrode layer of the dielectric elastomer transducer according to the third embodiment.

FIGS. 17 to 19 illustrate a dielectric elastomer transducer and a dielectric elastomer driving device of a third embodiment. In a dielectric elastomer transducer A3 and a dielectric elastomer driving device B3 of the embodiment, the electrode layer 3 has a rectangular shape that covers almost the entirety of the dielectric elastomer layer 2, as illustrated in FIGS. 17 and 18. However, the electrode layer 3 has three application portions 31, two coupling portions 32, and the connecting portion 33, as indicated in the figure with auxiliary lines and symbols. The three application portions 31 are arranged in the z direction and the coupling portions 32 are interposed between the adjacent application portions 31. As illustrated in FIG. 19, the electrode layer 4 has three application portions 41 that are disposed so as to be spaced away from each other in the axial direction z. The electrode layer 4 does not have a portion for coupling together the adjacent application portions 41. The three application portions 41 are thus insulated from each other. The dielectric elastomer function element 1 has three function portions 11 that are disposed so as to be spaced away from each other in the axial direction z.

As illustrated in FIG. 17, the dielectric elastomer driving device B3 has the wiring 71 and a plurality of the wirings 72. A through hole 54 is provided in each of the three supporting bodies 5. The wiring 71 is connected to a negative electrode of the power source unit 7 and is connected to the connecting portion 33 of the electrode layer 3. In this way, the wiring 71 is conductively connected to the application portions 31 via the connecting portion 33 and the coupling portions 32. The wirings 72 are connected to a positive electrode of the power source unit 7 and are individually connected to the three application portions 41 of the electrode layer 4. In the dielectric elastomer driving device B3, a voltage can thus be independently applied to each of the three function portions 11.

Even with such an embodiment, it is possible to avoid damaging the electrode layers 3, 4 and acquire a sufficient amount of expansion. Since a voltage can be individually applied to each of the three function portions 11, any one of the function portions 11 can be expanded as appropriate, in which the function portions 11 are set to be a configuration with a plurality of stages in the axial direction z. As illustrated in FIGS. 13 and 14 or in FIGS. 15 and 16, the plurality of application portions 31 are configured to be disposed so as to be spaced away in the circumferential direction θ and the plurality of application portions 41 are configured to be disposed so as to be spaced away in the circumferential direction θ. Thereby, the dielectric elastomer transducer A3 can be configured so that bending is possible in a plurality of stages in addition to expansion and contraction being possible in a plurality of stages.

Figure 20:
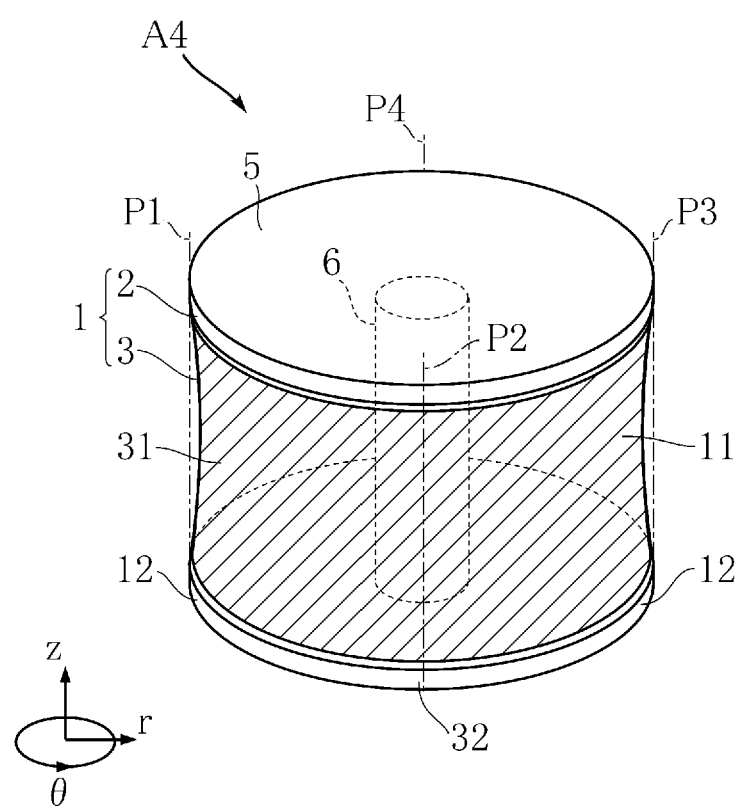
FIG. 20 is a perspective view of a dielectric elastomer transducer according to a fourth embodiment.

FIG. 20 illustrates a dielectric elastomer transducer based on a fourth embodiment. In a dielectric elastomer transducer A4 of the embodiment, the dielectric elastomer function element 1 has only one function portion 11. That is, the electrode layer 3 has only one application portion 31 and the electrode layer 4 has only one application portion 41. The electrode layer 3 and the electrode layer 4 may have the connecting portion 33 and the connecting portion 43 described above.

In the embodiment, the function portion 11 is spaced away from the supporting body 5 and is not fixed to the supporting body 5. In the dielectric elastomer function element 1, the electrode-less portion 12 is provided around the function portion 11. At least a portion of the electrode-less portion 12 is fixed to the supporting body 5 so that the dielectric elastomer function element 1 is supported by the supporting body 5 so as to have a tubular shape.

Even with such an embodiment, it is possible to avoid damaging the electrode layers 3, 4 and acquire a sufficient amount of expansion. As it is understood from the embodiment, the dielectric elastomer function element 1 only needs to have a configuration including one or more function portions 11 that are not fixed by the supporting body 5.

Figure 21:
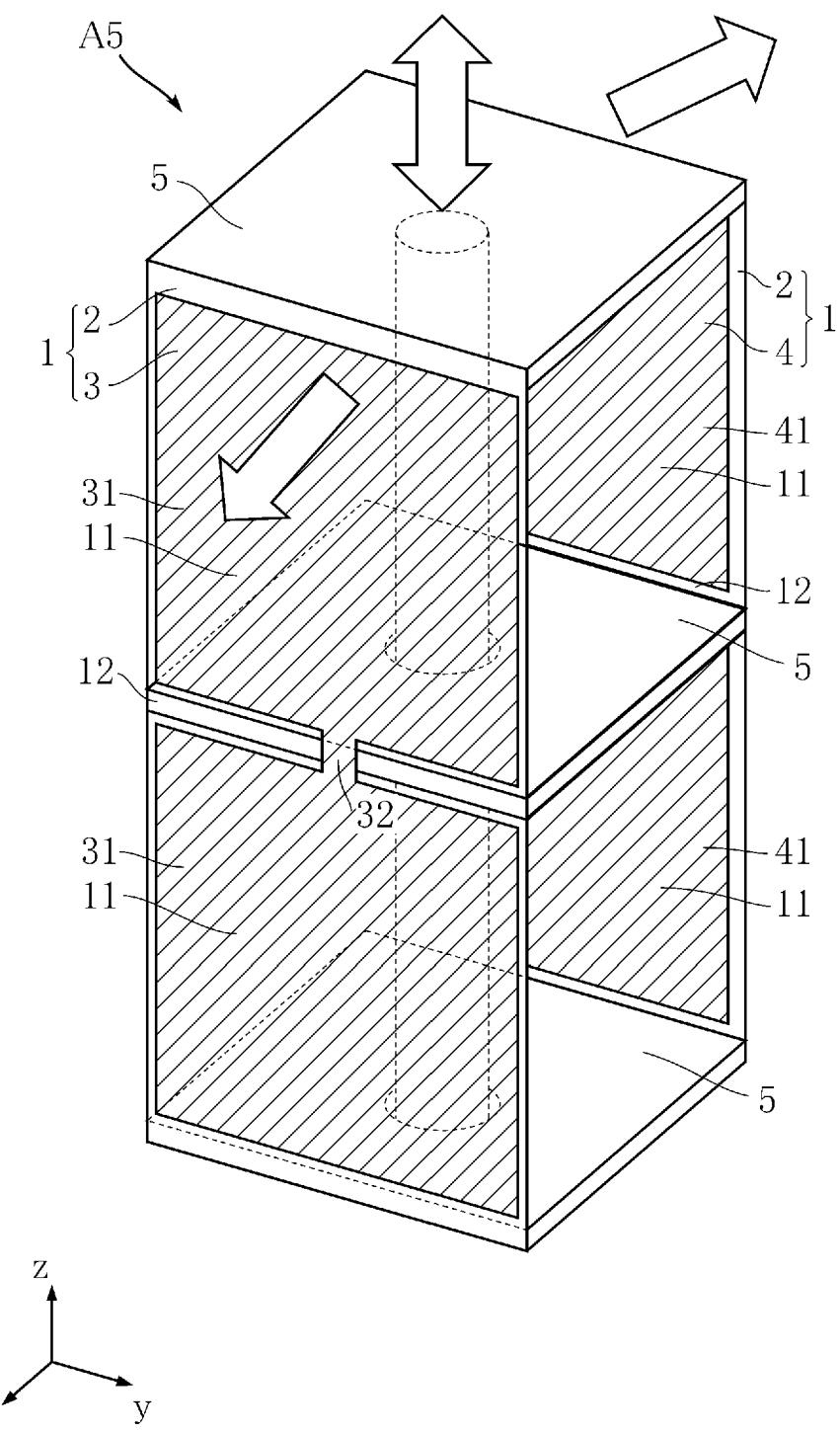
FIG. 21 is a perspective view of a dielectric elastomer transducer according to a fifth embodiment.

FIG. 21 illustrates a dielectric elastomer transducer based on a fifth embodiment. In a dielectric elastomer transducer A5 of the embodiment, basic shapes of the dielectric elastomer function element 1 and the number of dielectric elastomer function elements 1 differ from those of the embodiments described above.

In the embodiment, the dielectric elastomer function elements 1 have two dielectric elastomer layers 2, two electrode layers 3, and two electrode layers 4. Each dielectric elastomer layer 2 has a long rectangular shape, for example. Each electrode layer 3 has two application portions 31 and the coupling portion 32. The two application portions 31 are disposed side by side in the long side direction of the dielectric elastomer layer 2 and each have a rectangular shape, for example. Each electrode layer 4 has two application portions 41 and the coupling portion 42. The two application portions 41 are disposed side by side in the long side direction of the dielectric elastomer layer 2 and each have a rectangular shape, for example. With such a configuration, the dielectric elastomer function element 1 has two function portions 11 that are arranged side by side in the z direction and the electrode-less portion 12 that is positioned between the two function portions 11.

The dielectric elastomer transducer A5 has three supporting bodies 5. Each supporting body 5 has a rectangular plate shape in which there are four sides along the x direction and the y direction when viewed in the z direction, for example. The three supporting bodies 5 are disposed so as to be spaced away from each other in the z direction. One of the dielectric elastomer function elements 1 is fixed to a portion in a front part of the three supporting bodies 5 in the x direction. The other dielectric elastomer function element 1 is fixed to a portion in a back part of the three supporting bodies 5 in the x direction. Regarding the fixation of the dielectric elastomer function elements 1, the function portions 11 are not fixed to the supporting bodies 5 and the electrode-less portions 12 are fixed to the supporting bodies 5. From the viewpoint of causing a bending operation of the dielectric elastomer transducer A5 toward the x direction more smoothly, it is preferable that the supporting bodies 5 have a rectangular shape in which the x direction be set as a short side direction and the y direction be set as a long side direction, when viewed in the z direction.

Even with such an embodiment, it is possible to avoid damaging the electrode layers 3, 4 and acquire a sufficient amount of expansion. As it is understood from the embodiment, the shape of the dielectric elastomer function element 1 is not limited to a tubular shape and may be various shapes such as a flat plate shape or a frustum shape. It is possible to drive the dielectric elastomer transducer A5 in a plurality of directions by having a plurality of the dielectric elastomer function elements 1.

Figure 22:
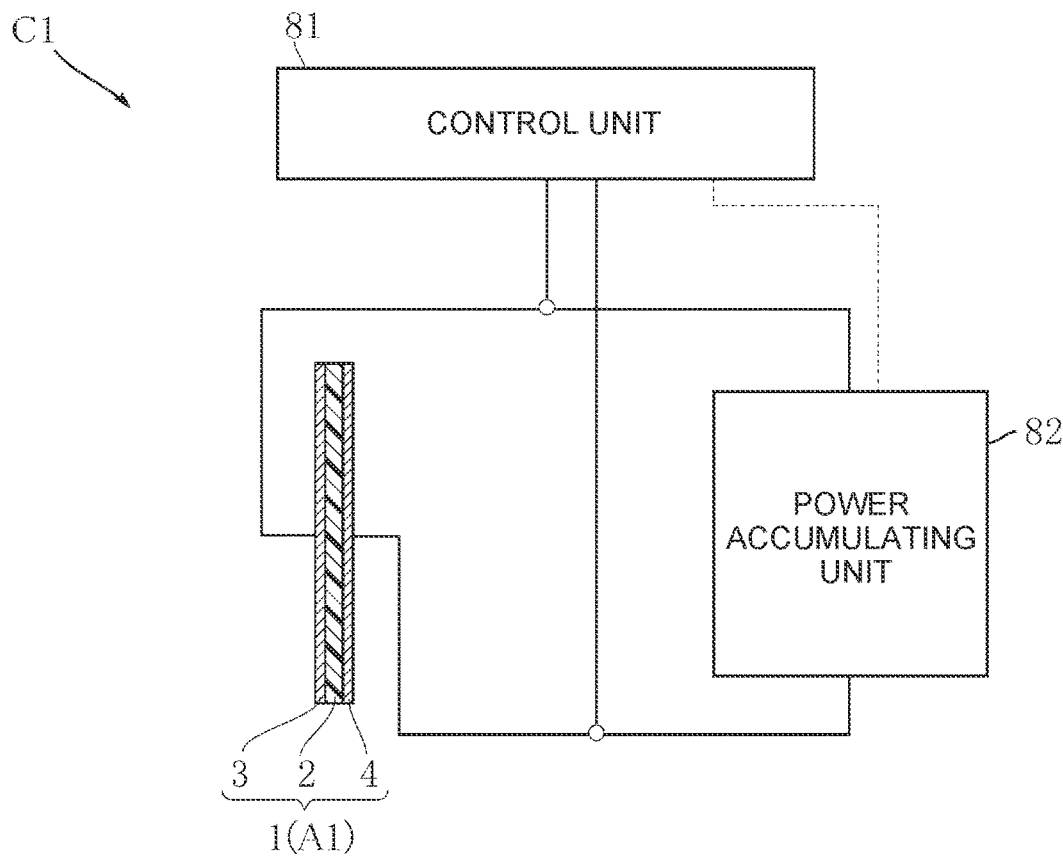
FIG. 22 is a configuration diagram of an example of a dielectric elastomer power generating device.

FIG. 22 illustrates an example of a dielectric elastomer power generating device. A dielectric elastomer power generating device C1 of the embodiment includes the dielectric elastomer transducer A1, a control unit 81, and a power accumulating unit 82. The dielectric elastomer power generating device C1 is a device that generates power with expansion and contraction of the dielectric elastomer function element 1.

In the dielectric elastomer power generating device C1, the dielectric elastomer transducers of various forms that are provided may be used in addition to the dielectric elastomer transducer A1.

The control unit 81 controls as appropriate, application of initial voltages to the electrode layer 3 and the electrode layer 4 of the dielectric elastomer function element 1 and output voltages from the electrode layer 3 and the electrode layer 4. The control unit 81 performs switching control of a switch (not shown) that is necessary when the application and an input are performed. The above control unit 81 includes a power source unit that generates an initial charge, a power transformation unit that performs a function such as transforming an output voltage into a voltage suitable for usage, and a CPU that controls the power source unit and the power transformation unit, for example.

The power accumulating unit 82 is a power accumulating means of the dielectric elastomer power generating device C1, to which power output from the dielectric elastomer transducer A1 is input. The configuration of the power accumulating unit 82 is not specifically limited, and may be a configuration having a power accumulating capacity of which power generated by the dielectric elastomer transducer A1 can be accumulated. Examples of a so-called rechargeable battery that configures the power accumulating unit 82 are a nickel-hydrogen battery and a lithium-ion battery. The power accumulating unit 82 may have a voltage step-down circuit that lowers an input voltage to a voltage that is suitable for a secondary battery.

When generating power with the dielectric elastomer power generating device C1, an initial voltage is first applied while the dielectric elastomer function element 1 is expanded. When the dielectric elastomer function element 1 expands and contracts due to the removal or action of an external force, an electrostatic capacity of the dielectric elastomer function element 1 serving as a capacitor is decreased. In conjunction with the decrease in the electrostatic capacity, the voltage in the dielectric elastomer function element 1 is increased so as to be higher than the initial voltage. A power that corresponds to the voltage by which the increased voltage is higher than the initial voltage is a voltage that is acquired by power generation in the dielectric elastomer power generating device C1.

As it is understood from the embodiment, the application of the dielectric elastomer transducer is not limited to driving, and may be used for power generation.

Figure 23:
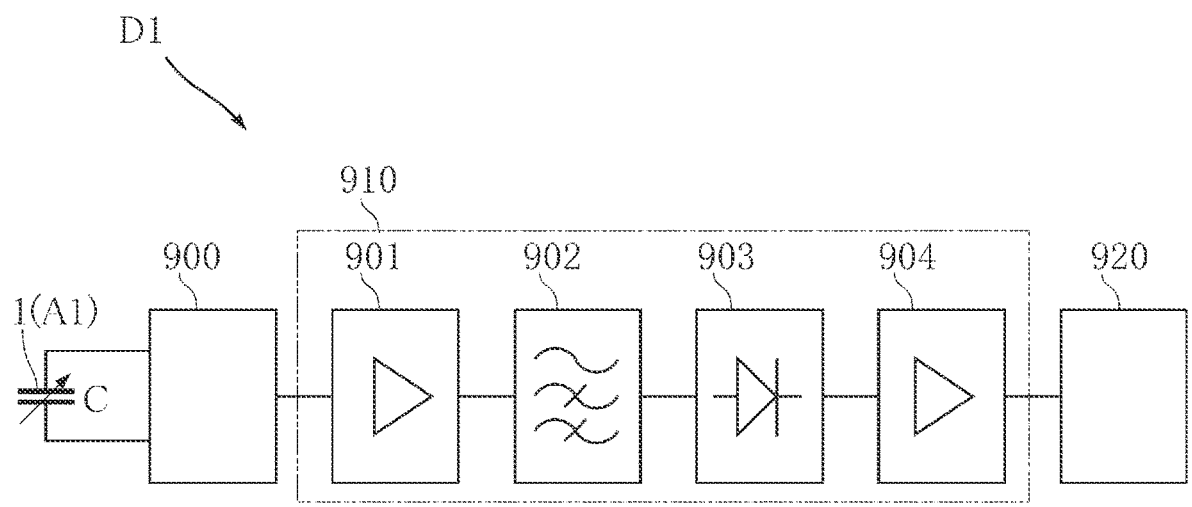
FIG. 23 is a configuration diagram of an example of a dielectric elastomer sensor device.
Figure 24:
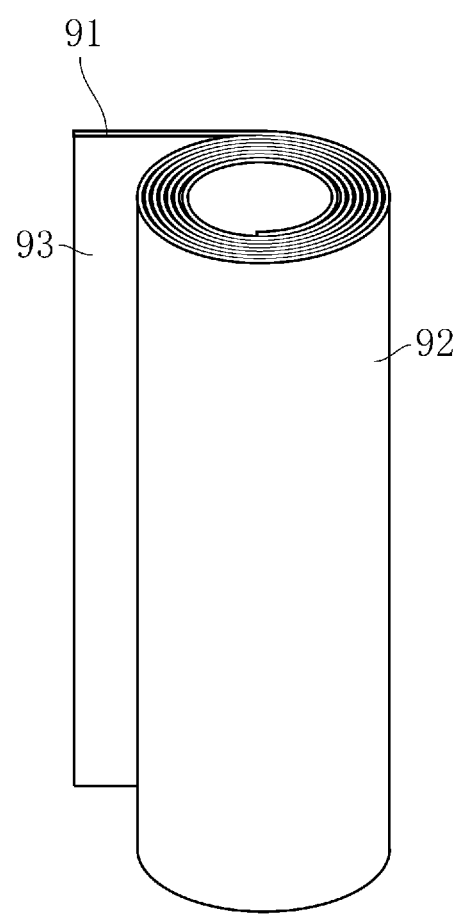
FIG. 24 is a perspective view of a dielectric elastomer layer and an electrode layer used in an example of a conventional dielectric elastomer transducer.
Figure 25:
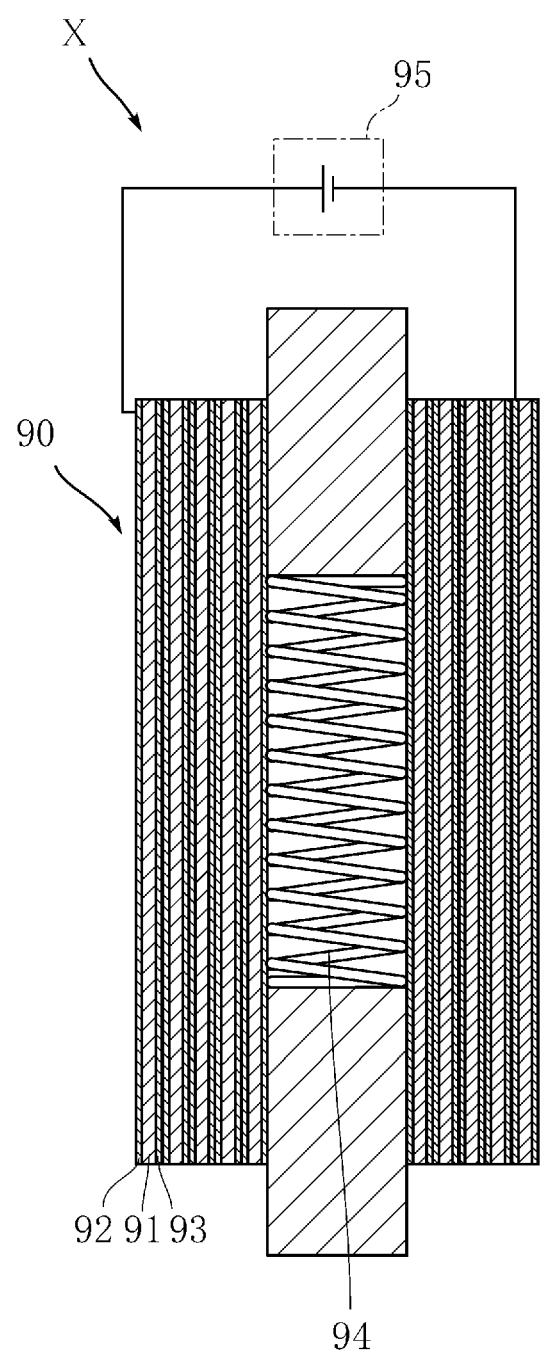
FIG. 25 is a sectional view of an example of a conventional dielectric elastomer transducer and a conventional dielectric elastomer driving device.

FIG. 23 illustrates an example of a dielectric elastomer sensor device. A dielectric elastomer sensor device D1 of the embodiment includes the dielectric elastomer transducer A1, an oscillation driving unit 900, an intermediate circuit 910, and a determination circuit 920. The dielectric elastomer sensor device D1 is a device that detects an operation of a target object etc. based on expansion and contraction (deformation) of the dielectric elastomer function element 1.

The dielectric elastomer transducer A1 and the oscillation driving unit 900 configure an oscillation circuit and output alternating current electric signals. The dielectric elastomer function element 1 is regarded as and used as a variable capacitor. For example, along with the dielectric elastomer function element 1 serving as a variable capacitor and a power source for generating alternating current electric signals, the oscillation driving unit 900 configures a CR oscillation circuit, an LC oscillation circuit, and an oscillation circuit that uses a timer IC etc. that are conventionally known. Output frequencies of the alternating current electric signals change in conjunction with the change in the electrostatic capacity of the dielectric elastomer function element 1.

The determination circuit 920 determines the change in the electrostatic capacity of the dielectric elastomer function element 1 based on the output signals from the oscillation circuit described above. The configuration of the determination circuit 920 is not specifically limited, and only needs to be a configuration in which the relationship between the output signals of the oscillation circuit and the electrostatic capacity can be determined based on various methods that are conventionally known. The specific configuration of the determination circuit 920 is suitably selected based on whether there is a circuit for processing the output signals from the oscillation circuit as appropriate, such as the intermediate circuit 910 described below, and the configuration of such a circuit. Examples of the determination circuit 920 are a microcomputer, an A/D converter IC, a comparator, an oscilloscope etc. In the illustrated example, the determination circuit 920 is a circuit that determines the change in the electrostatic capacity of the dielectric elastomer function element 1 from the frequency of the direct current electric signal, in a case where the output signals from the oscillation circuit are converted into electric signals that are periodically varied in one polarity (hereinafter referred to as direct current electric signals). That is, when the frequency of the direct current electric signal serving as the output signal of the oscillation circuit is changed from the frequency that corresponds to an initial electrostatic capacity of the dielectric elastomer function element 1, it is determined that an electrostatic capacity C of the dielectric elastomer function element 1 is changed. A determination reference such as a threshold may be adopted as appropriate for such a determination.

The intermediate circuit 910 processes the output signal of the oscillation circuit described above into a signal that is suitable for determination by the determination circuit 920. In the case of a configuration in which the determination circuit 920 can directly determine the output signal of the oscillation circuit, the intermediate circuit 910 may be omitted. However, in order to suitably determine the relationship between the frequency of the alternating current electric signal that is the output signal of the oscillation circuit and the electrostatic capacity C, it preferable and realistic that the intermediate circuit 910 including a filter circuit 902 be provided. In the illustrated example, the intermediate circuit 910 has an alternating current amplifier circuit 901, the filter circuit 902, a wave detection circuit 903, and a direct current amplifier circuit 904. The intermediate circuit 910 is configured to convert the output signal of the oscillation circuit from the alternating current electric signal into the direct current electric signal.

The alternating current amplifier circuit 901 amplifies the alternating current electric signal from the oscillation circuit so as to widen a dynamic range. When a signal level of the alternating current electric signal of the oscillation circuit is sufficient, the alternating current amplifier circuit 901 may be omitted. The alternating current amplifier circuit 901 is not specifically limited, and examples of the alternating current amplifier circuit 901 are a transistor, an FET, an operational amplifier etc.

The filter circuit 902 allows a signal of a desired frequency band included in the alternating current electric signal of the oscillation circuit to pass through, and attenuates or interrupts a signal of an unnecessary frequency band. The filter circuit 902 is not specifically limited, and examples of the filter circuit 902 are a high pass filter, a low pass filter, a band pass filter, a band elimination filter etc. In the illustrated example, the case in which the high pass filter is adopted is shown. The specific configuration of the filter circuit 902 is selected based on a variation width of a direct voltage output from the wave detection circuit 903.

The wave detection circuit 903 converts into direct current, the output signal of the oscillation circuit described above that is the alternating current electric signal output from the filter circuit 902. The wave detection circuit 903 is not particularly limited, and examples of the wave detection circuit 903 are a half wave rectification circuit or a full wave rectification circuit using a diode. It is preferable that the wave detection circuit 903 having a configuration with a satisfactory response characteristic be used for speeding up determination of the electrostatic capacity of the dielectric elastomer function element 1.

The direct current amplifier circuit 904 amplifies to a signal level suitable for determination by the determination circuit 920, the output signal of the oscillation circuit that is the direct current electric signal output from the wave detection circuit 903. When the level of the direct current electric signal from the wave detection circuit 903 is sufficient, the direct current amplifier circuit 904 may be omitted.

As it is understood from the embodiment, the application of the dielectric elastomer transducer is not limited to driving, and may be used for a sensor.

A dielectric elastomer driving device is not limited to the embodiments described above. Designs of the specific configurations of each portion of the dielectric elastomer driving device can be variously changed.

The invention claimed is:

1. A dielectric elastomer transducer comprising a dielectric elastomer function element having a dielectric elastomer layer and a pair of electrode layers between which the dielectric elastomer layer is interposed, and
further comprising a supporting body that supports the dielectric elastomer function element, wherein
each of the electrode layers has one or more application regions,
the dielectric elastomer function element has one or more function portions on which the application regions of the electrode layers are overlapped, and
the function portion is spaced away from the supporting body.

2. The dielectric elastomer transducer according to claim 1, wherein
the dielectric elastomer function element has one or more electrode-less portions in which the electrode layer is not provided, and
the electrode-less portion is fixed to the supporting body.

3. The dielectric elastomer transducer according to claim 2, wherein the dielectric elastomer function element has a tubular shape.

4. The dielectric elastomer transducer according to claim 3, wherein the dielectric elastomer function element has a tubular shape in which at least the function portion is a single sheet without overlapping.

5. The dielectric elastomer transducer according to claim 3, wherein the dielectric elastomer function element has a plurality of the function portions that are spaced away from each other in an axial direction.

6. The dielectric elastomer transducer according to claim 5, wherein
the electrode layer has a coupling portion that couples together the application regions, and
the coupling portion is not fixed to the supporting body.

7. The dielectric elastomer transducer according to claim 6, wherein the coupling portion of one of the electrode layers does not overlap with the other electrode layer.

8. The dielectric elastomer transducer according to claim 3, wherein the application region is divided into a plurality of portions in a circumferential direction.

9. The dielectric elastomer transducer according to claim 3, wherein the supporting body is formed of a plurality of plate members that have a circular shape when viewed in an axial direction and that are disposed so as to be spaced away in the axial direction.

10. The dielectric elastomer transducer according to claim 1, wherein the dielectric elastomer function element has a tubular shape.

11. The dielectric elastomer transducer according to claim 10, wherein the dielectric elastomer function element has a tubular shape in which at least the function portion is a single sheet without overlapping.

12. The dielectric elastomer transducer according to claim 10, wherein the dielectric elastomer function element has a plurality of the function portions that are spaced away from each other in an axial direction.

13. The dielectric elastomer transducer according to claim 12, wherein
the electrode layer has a coupling portion that couples together the application regions, and
the coupling portion is not fixed to the supporting body.

14. The dielectric elastomer transducer according to claim 13, wherein the coupling portion of one of the electrode layers does not overlap with the other electrode layer.

15. The dielectric elastomer transducer according to claim 10, wherein the application region is divided into a plurality of portions in a circumferential direction.

16. The dielectric elastomer transducer according to claim 10, wherein the supporting body is formed of a plurality of plate members that have a circular shape when viewed in an axial direction and that are disposed so as to be spaced away in the axial direction.

17. The dielectric elastomer transducer according to claim 1, further comprising a wiring connected to the application region.

18. The dielectric elastomer transducer according to claim 1, further comprising a tensile force maintaining body that causes the dielectric elastomer function element to expand.

19. A dielectric elastomer driving device comprising:
the dielectric elastomer transducer according to claim 1; and
a power source unit for applying a voltage to the dielectric elastomer transducer.

* * * * *